US011158384B1

(12) United States Patent
Yabe

(10) Patent No.: US 11,158,384 B1
(45) Date of Patent: Oct. 26, 2021

(54) APPARATUS AND METHODS FOR CONFIGURABLE BIT LINE ISOLATION IN NON-VOLATILE MEMORY

(71) Applicant: SanDisk Technologies LLC, Addison, TX (US)

(72) Inventor: Hiroki Yabe, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/878,919

(22) Filed: May 20, 2020

(51) Int. Cl.

| | |
|---|---|
| ***G11C 16/24*** | (2006.01) |
| ***G11C 16/04*** | (2006.01) |
| ***H01L 27/11556*** | (2017.01) |
| ***H01L 27/11582*** | (2017.01) |
| ***G11C 16/26*** | (2006.01) |
| ***H01L 27/11565*** | (2017.01) |
| ***H01L 27/11519*** | (2017.01) |

(52) U.S. Cl.
CPC .......... *G11C 16/24* (2013.01); *G11C 16/0483* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC ......... G11C 16/24; G11C 16/26; G11C 16/28; G11C 16/0483; H01L 27/11519; H01L 27/11565; H01L 27/11582; H01L 27/11556
See application file for complete search history.

(56) References Cited

U.S. PATENT DOCUMENTS

| | | | | |
|---|---|---|---|---|
| 8,755,232 B2 * | 6/2014 | Huang | G11C 16/10 365/185.18 |
| 2016/0027504 A1 * | 1/2016 | Lee | G11C 16/3459 365/185.03 |
| 2018/0226128 A1 | 8/2018 | Park et al. | |
| 2020/0202943 A1 | 6/2020 | Joe et al. | |
| 2020/0227435 A1 * | 7/2020 | Hwang | H01L 27/11582 |

* cited by examiner

*Primary Examiner* — David Lam
(74) *Attorney, Agent, or Firm* — Vierra Magen Marcus LLP

(57) ABSTRACT

An apparatus is provided that includes a plurality of NAND strings having a common set of word lines. Each NAND string includes data memory cells for data storage and dummy memory cells connected in series with the data memory cells. A first group of NAND strings includes dummy memory cells with a first pattern of threshold voltages and a second group of NAND strings includes dummy memory cells with a second pattern of threshold voltages for separate isolation of data memory cells of the first and second groups of NAND strings from corresponding bit lines.

20 Claims, 22 Drawing Sheets

| | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

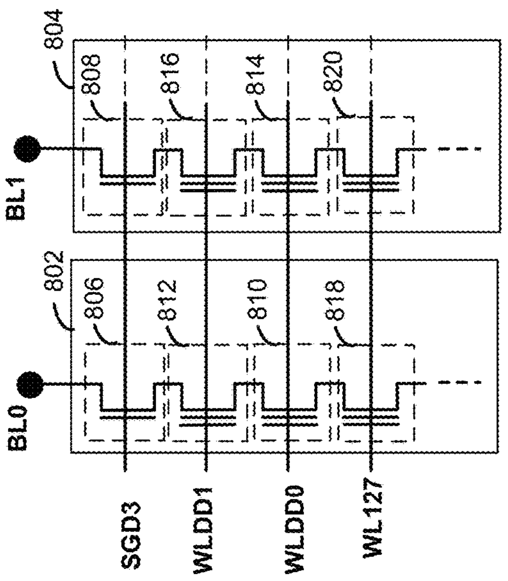
FIG. 8A
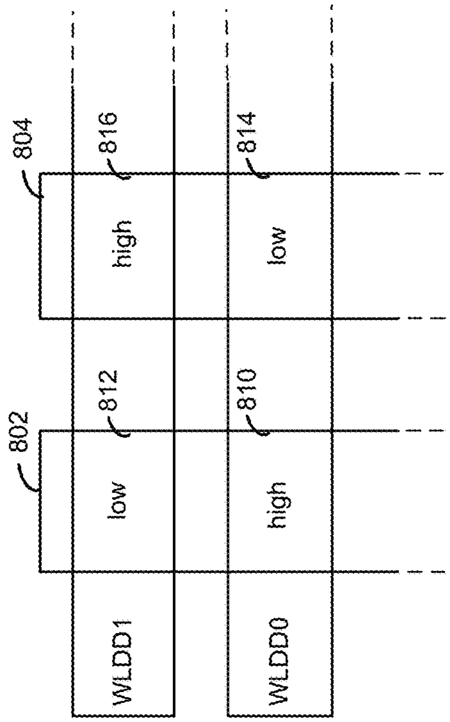
FIG. 8B
| | BL0/NAND string 802 | BL1/NAND string 804 |
|---|---|---|
| WLDD1 low | Cell 812 on | Cell 816 off |
| WLDD0 high | Cell 810 on | Cell 814 on |
| BL-cell | Electrically connected | Electrically isolated |
FIG. 8C
| | BL0/NAND string 802 | BL1/NAND string 804 |
|---|---|---|
| WLDD1 high | Cell 812 on | Cell 816 on |
| WLDD0 low | Cell 810 off | Cell 814 on |
| BL-cell | Electrically isolated | Electrically connected |
FIG. 8D

| | BL<0> | BL<1> | BL<2> | BL<3> | BL<4> | BL<5> | BL<6> | BL<7> | BL<8> | BL<9> | BL<10> | BL<11> | BL<12> | BL<13> | BL<14> | BL<15> |
|---|---|---|---|---|---|---|---|---|---|---|---|---|---|---|---|---|
| WLDD<0> | 3 | 5 | 5 | 5 | 5 | 3 | 5 | 5 | 3 | 5 | 5 | 5 | 5 | 3 | 5 | 5 |
| WLDD<1> | 5 | 3 | 5 | 5 | 3 | 5 | 5 | 5 | 5 | 3 | 5 | 5 | 3 | 5 | 5 | 5 |
| WLDD<2> | 5 | 5 | 3 | 5 | 5 | 5 | 5 | 3 | 5 | 5 | 3 | 5 | 5 | 5 | 5 | 3 |
| WLDD<3> | 5 | 5 | 5 | 3 | 5 | 5 | 3 | 5 | 5 | 5 | 5 | 3 | 5 | 5 | 3 | 5 |

| Group | Bit lines of NAND group | | | | Dummy word line voltage | | | |
|---|---|---|---|---|---|---|---|---|
| | | | | | WLDD<0> | WLDD<1> | WLDD<2> | WLDD<3> |
| 1st Group | BL<0> | BL<5> | BL<8> | BL<13> | 4V | 6V | 6V | 6V |
| 2nd Group | BL<1> | BL<4> | BL<9> | BL<12> | 6V | 4V | 6V | 6V |
| 3rd Group | BL<2> | BL<7> | BL<10> | BL<15> | 6V | 6V | 4V | 6V |
| 4th Group | BL<3> | BL<6> | BL<11> | BL<14> | 6V | 6V | 6V | 4V |

FIG. 9C

| | SA0 | SA1 | SA2 | SA3 |
|---|---|---|---|---|
| Page 0 | $B_0$ | $B_5$ | $B_8$ | $B_{13}$ |
| Page 1 | $B_1$ | $B_4$ | $B_9$ | $B_{12}$ |
| Page 2 | $B_2$ | $B_7$ | $B_{10}$ | $B_{15}$ |
| Page 3 | $B_3$ | $B_6$ | $B_{11}$ | $B_{14}$ |

APPARATUS AND METHODS FOR CONFIGURABLE BIT LINE ISOLATION IN NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). It is important that the process for programming data into the memory system be fast so that the host device (or other client) does not have to wait very long for the memory system to finish programming.

BRIEF DESCRIPTION OF THE DRAWINGS

Like-numbered elements refer to common components in the different Figures (FIGs).

FIGS. 8A-E illustrate examples of two groups of bit lines with configurable electrical connection/isolation using dummy memory cells.

FIGS. 9A-C illustrate examples of four groups of bit lines with configurable electrical connection/isolation using dummy memory cells.

DETAILED DESCRIPTION

Technology is described for configurable isolation of bit lines connected to NAND strings that share a common set of word lines and select lines. For example, NAND strings that are individually connected to corresponding bit lines and that share the same set of word lines and select lines may be grouped into two or more groups. In one or more groups, bit lines may be substantially electrically isolated from memory cells so that little or no current flows from bit lines of such group(s) through NAND strings. In at least one group, bit lines may be electrically coupled to memory cells of corresponding NAND strings so that current may flow from bit lines of such a group, through NAND strings, e.g. discharging corresponding bit lines that are pre-charged. This may allow discharge of a selected group of bit lines while other bit lines remain substantially electrically isolated so that bit lines that are pre-charged together may be separately discharged (e.g. for separate reading of memory cells). Such configurable isolation of bit lines may facilitate accurate reading of memory cells of a selected group of NAND strings by reducing noise that may result from discharge of unselected bit lines (idle bit lines).

In an embodiment, dummy memory cells of NAND strings are configured to provide selective isolation of memory cells of the NAND strings and corresponding bit lines. For example, dummy memory cells may be configured with two or more different threshold voltages, e.g. a first (lower) threshold voltage and a second (higher) threshold voltage. Different dummy word line voltages may be applied to different dummy word lines to cause isolation or coupling of different NAND strings. For example, a first (lower) voltage and a second (higher) voltage may be applied, where the first voltage is sufficient to turn on dummy memory cells configured with the first threshold voltage without turning on dummy memory cells configured with the second threshold voltage. The second voltage may be sufficient to turn dummy memory cells configured with either the first or second threshold voltage. By applying the first voltage on a given dummy word line, dummy memory cells configured with the first threshold voltage along that dummy word line are turned on while dummy memory cells configured with the second threshold voltage along that dummy word line are off. Arranging dummy memory cells configured with the first and second threshold voltages in appropriate patterns allows different groups of bit lines to be coupled or isolated by applying different dummy word line voltage schemes. This allows a large number of bit lines to be pre-charged together before a read command and associated addresses are received (e.g. before the addresses to be read are known). Subsequently, when addresses are received, selected bit lines may be discharged without discharging unselected bit lines, which may reduce noise and allow shorter read times.

Figure 1:
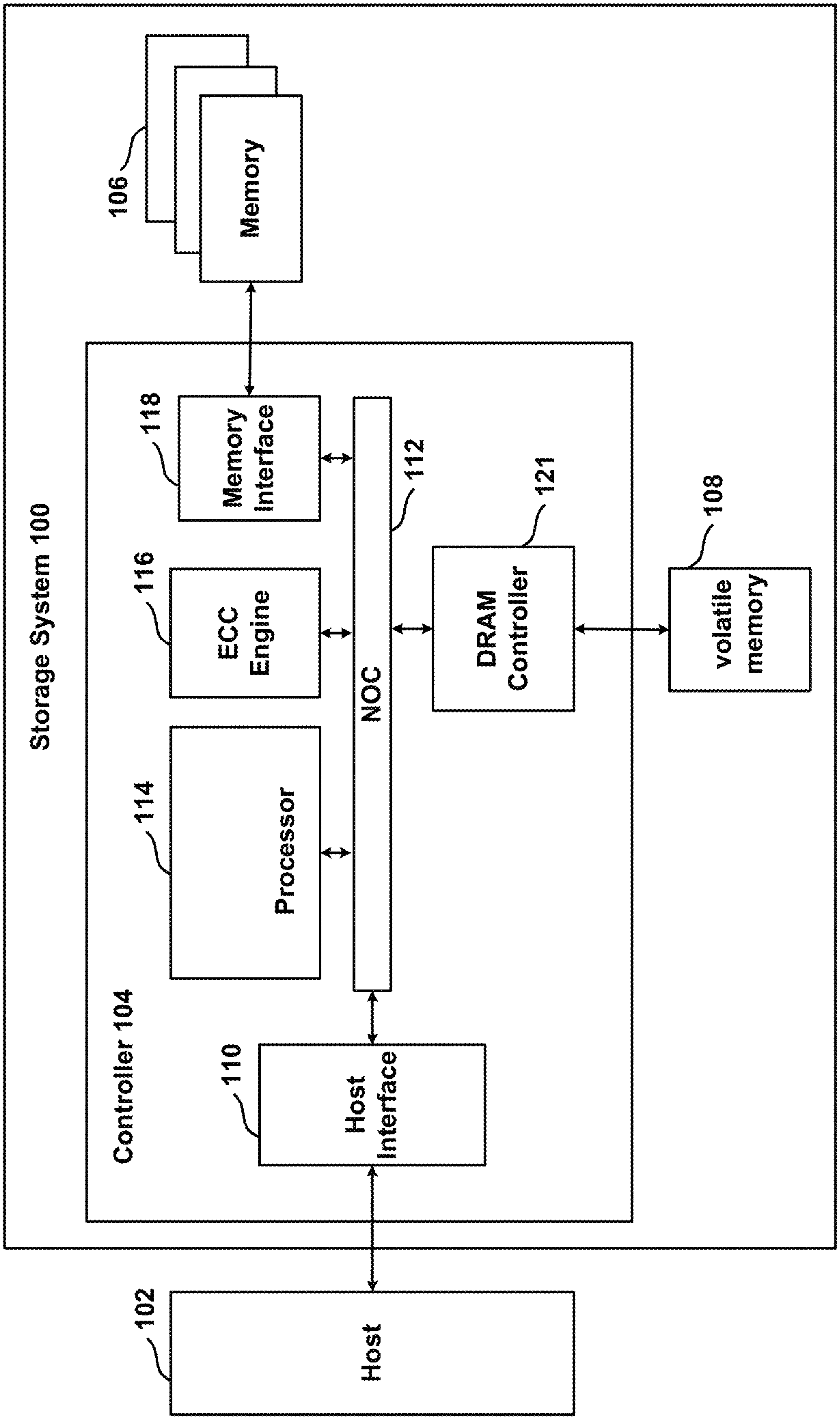
FIG. 1 is a block diagram depicting one embodiment of a memory system.

FIG. 1 is a block diagram of an embodiment of a data storage system 100 that implements the described technology. In an embodiment, storage system 100 is a solid-state drive ("SSD"). Storage system 100 also can be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a controller 104 connected to one or more memory die 106 and local high-speed volatile memory 108 (e.g., DRAM). The one or more memory die 106 each include a plurality of non-volatile memory cells. More information about the structure of each memory die 106 is provided below with respect to FIG. 2. Local high-speed volatile memory 108 is used by controller 104 to perform certain functions. For example, local high-speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 121. DRAM controller 121 is used to operate and communicate with local high-speed volatile memory 108 (e.g., DRAM). In other embodiments, local high-speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high-speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
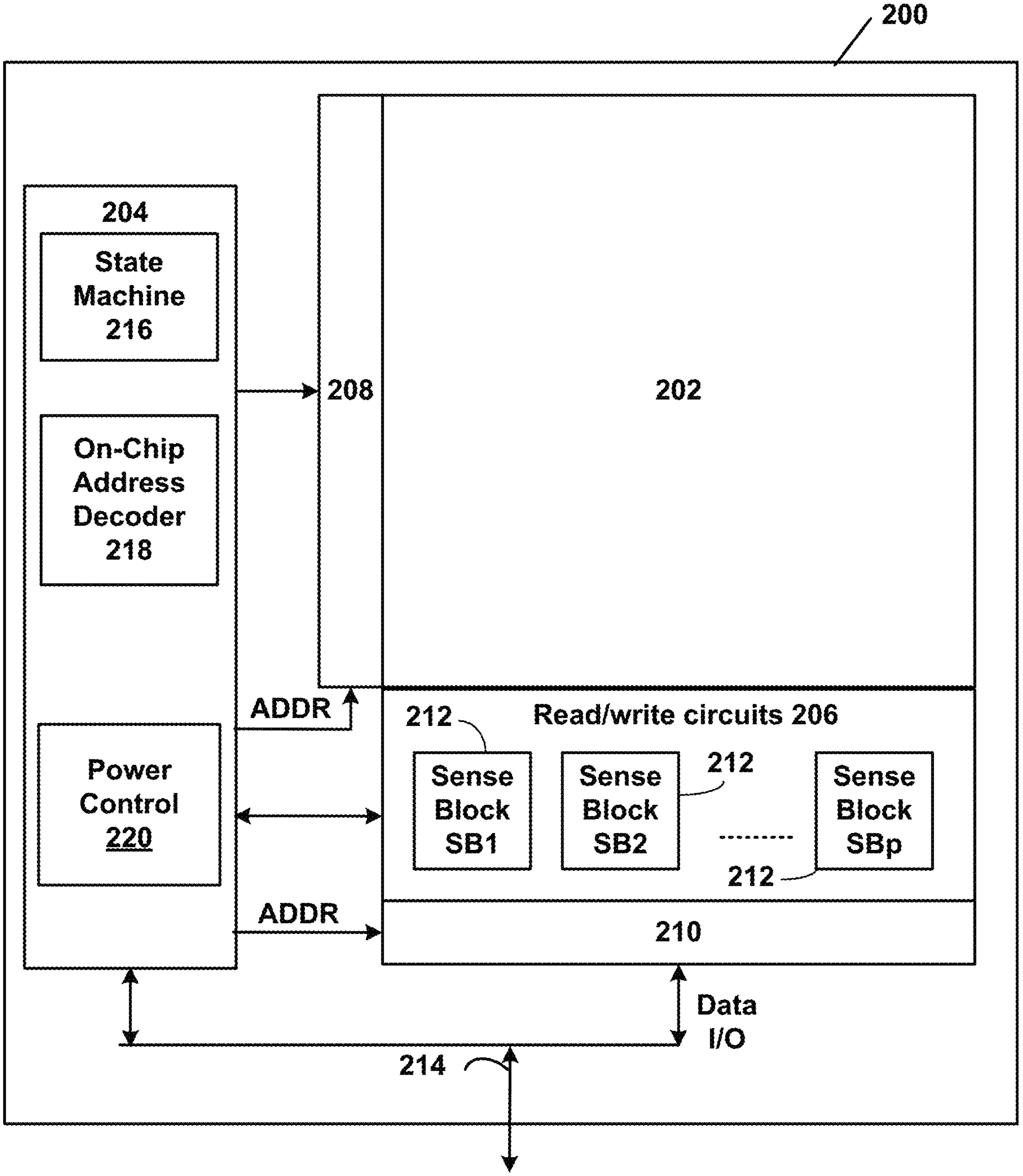
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 includes a sense amplifier and a set of latches connected to the bit line. The latches store data to be written and/or data that has been read. In an embodiment, each sense block 212 includes bit line drivers. In an embodiment, commands and data are transferred between controller 104 (FIG. 1) and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control module 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 (FIG. 1) to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 (FIG. 1) can operate as the control circuit or can be part of the control circuit. The control circuit can also be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new claimed embodiments proposed herein.

Other examples of suitable technologies for memory cells of the memory structure 202 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 202 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
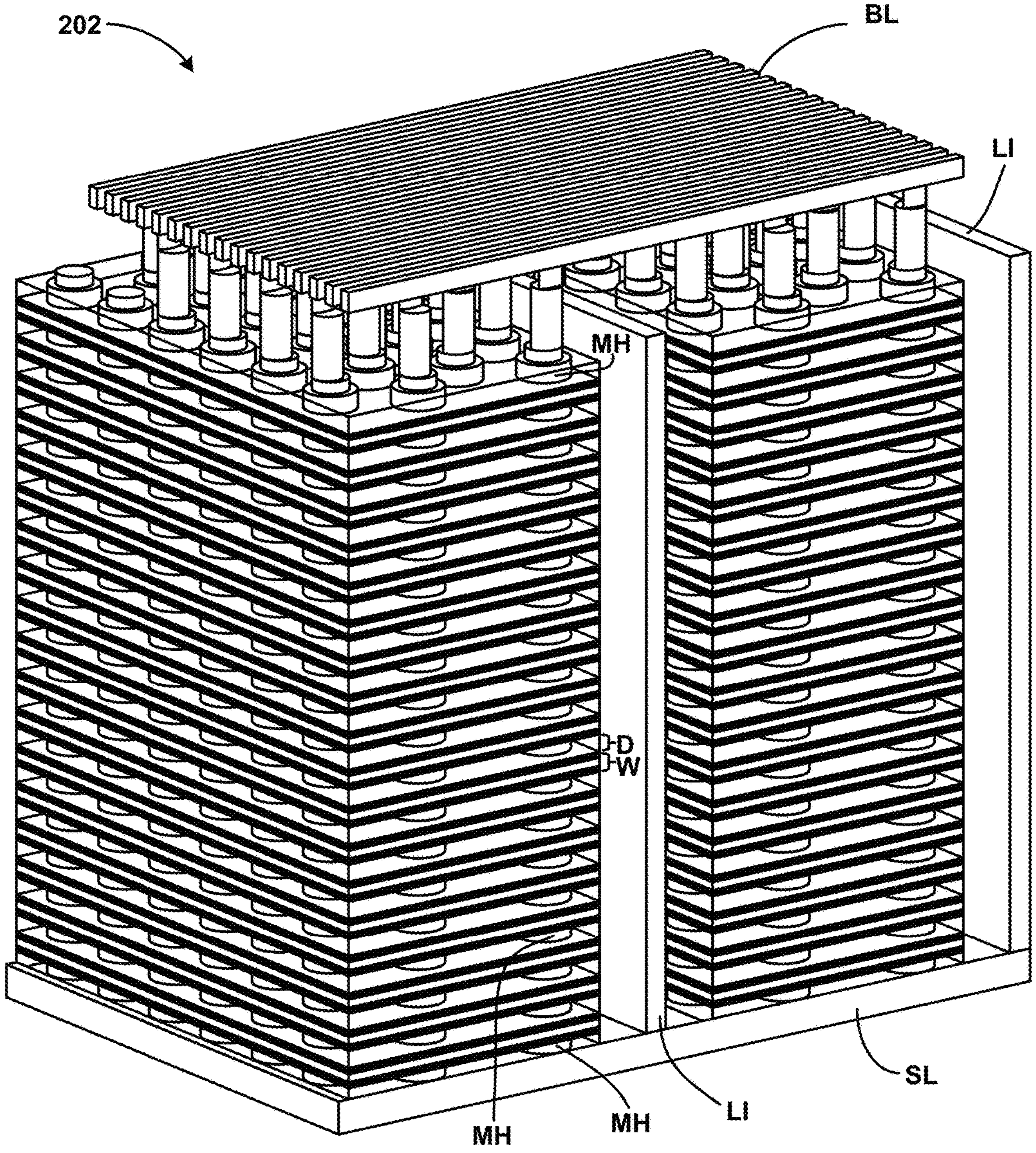
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI.

Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of the three dimensional memory array that comprises memory structure 202 is provided below with respect to FIG. 4A-4F.

Figure 4A:
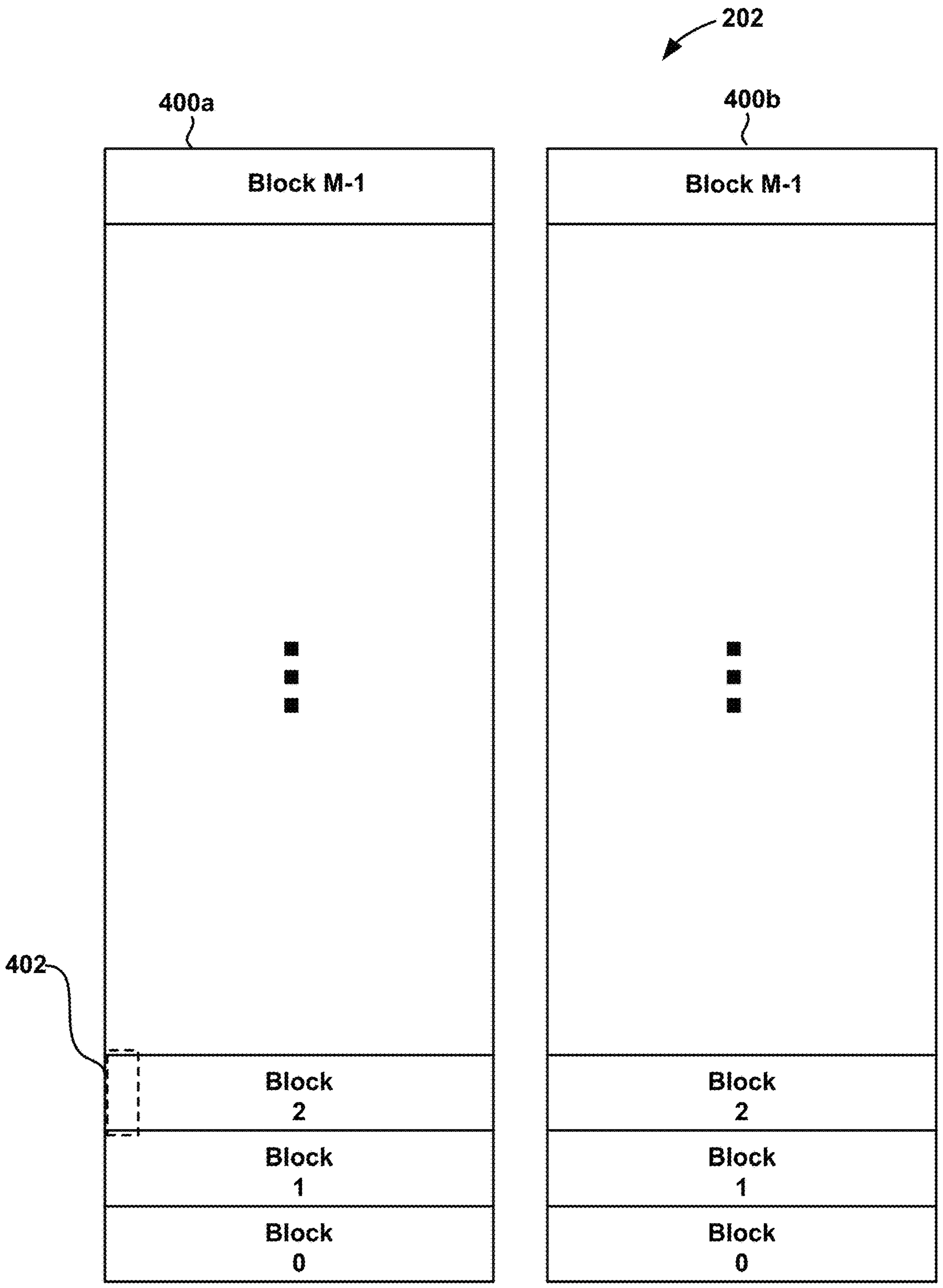
FIG. 4A is a block diagram of a memory structure having two planes.

FIG. 4A is a block diagram explaining one example organization of memory structure 202, which is divided into two planes 400*a* and 400*b*. Both planes are on the same memory die 200 (see FIG. 2). Each plane is then divided into M blocks. In one example, each plane has about 2000 blocks. However, different numbers of blocks and planes also can be used. A portion 402 of block 2 of memory plane 400*a* is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
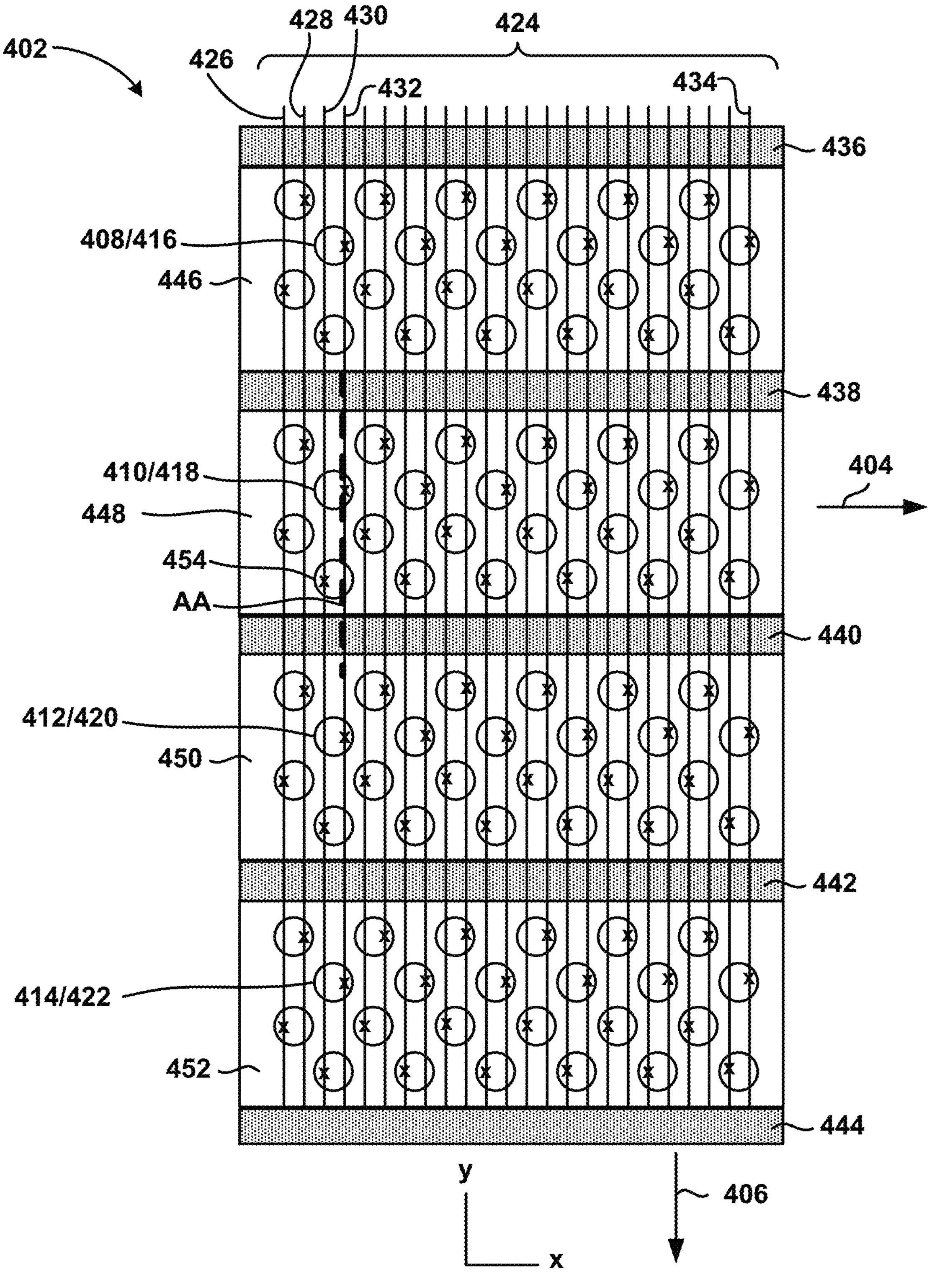
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. Each of the memory holes include multiple select transistors (also referred to as a select gate or selection gate) and multiple memory cells. In an embodiment, each memory hole implements a NAND string.

For example, FIG. 4B depicts memory holes 408, 410, 412 and 414. Memory hole 408 implements NAND string 416. Memory hole 410 implements NAND string 418. Memory hole 412 implements NAND string 420. Memory hole 414 implements NAND string 422. More details of the memory holes are provided below. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty-four bit lines because only a portion of the block is depicted. It is contemplated that more than twenty-four bit lines connected to memory holes of the block. Each of the circles representing memory holes has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into regions 446, 448, 450 and 452, which are referred to as fingers. In the layers of the block that implement memory cells, regions 446, 448, 450 and 452 are referred to as word line fingers that are separated by the local interconnects.

In an embodiment, the word line fingers on a common level of a block connect together to form a single word line. In another embodiment, the word line fingers on the same level are not connected together. In one example implementation, a bit line only connects to one memory hole in each of regions 446, 448, 450 and 452. In that implementation, each block has sixteen rows of active columns and each bit line connects to four rows in each block.

In an embodiment, all of four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows each of regions 446, 448, 450 and 452 having four rows of memory holes, four regions and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
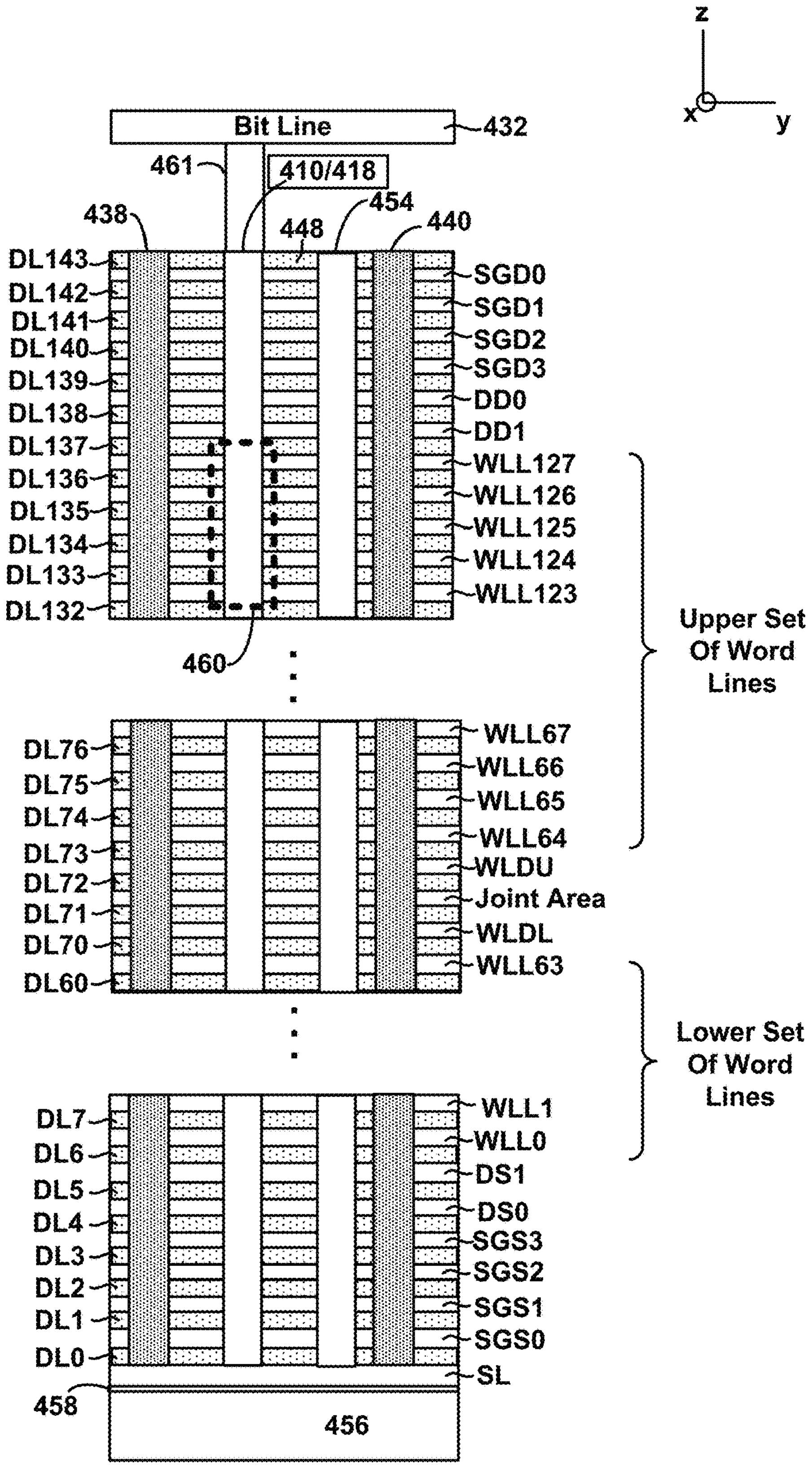
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross-sectional view cuts through memory holes 410 and 454 and region 448 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty-eight word lines.

Memory holes 410 and 454 are depicted protruding through the drain side select layers, source side select layers, dummy word line layers and word line layers. In one embodiment, each memory hole includes a vertical NAND string. For example, memory hole 410 includes NAND string 418. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 461. Local interconnects 438 and 440 are also depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layers DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred- and twenty-eight-word line layers intermixed with dielectric layers. To ease this burden, one embodiment includes laying down a first stack of sixty-four-word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
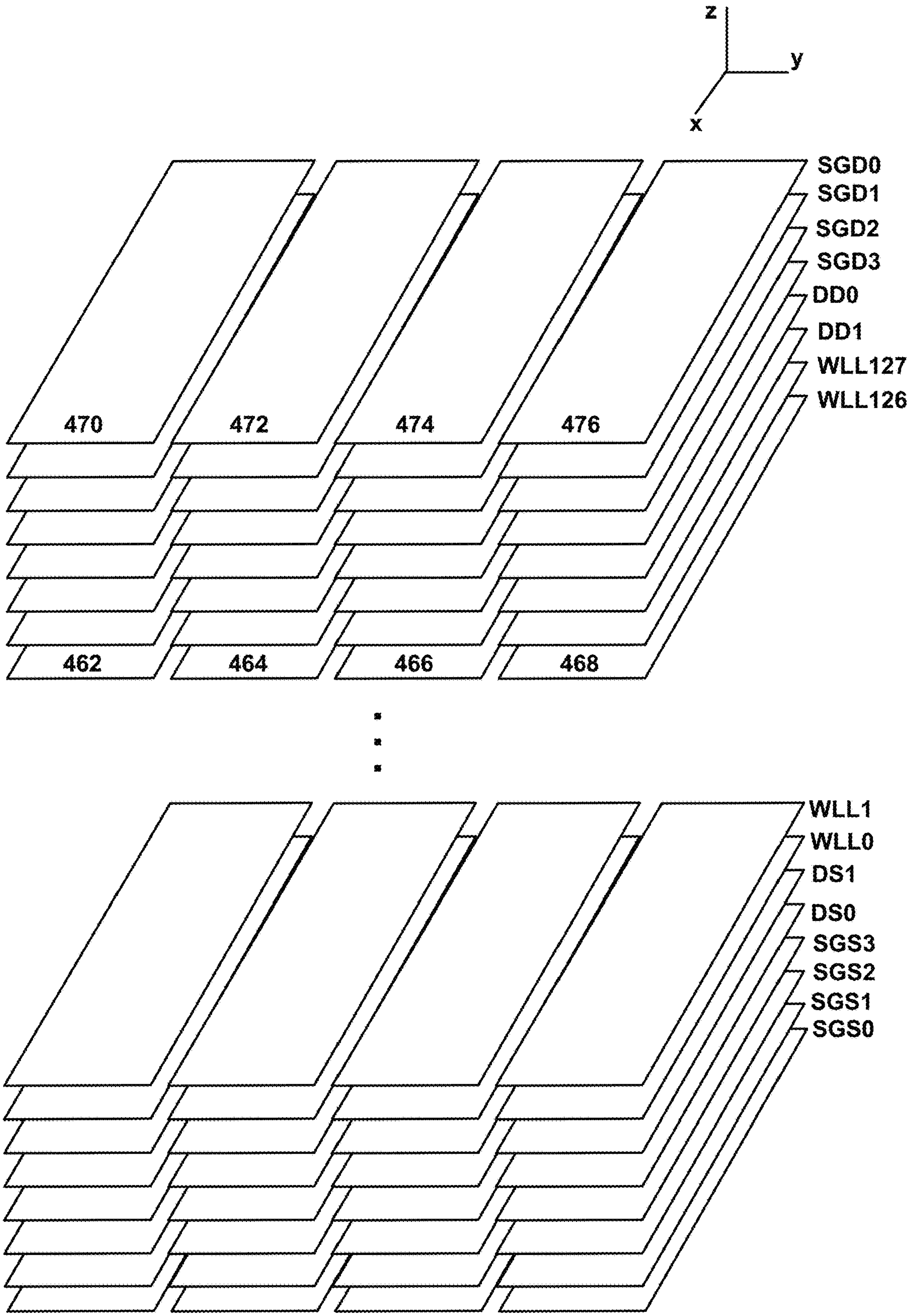
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers. For example, word line layer WLL126 is divided into regions 462, 464, 466 and 468. In an embodiment, the four-word line fingers on a same level are connected together. In another embodiment, each word line finger operates as a separate word line. Likewise, drain side select gate layer SGD0 (the top layer) is divided into regions 470, 472, 474 and 476, also known as fingers or select line fingers. In an embodiment, the four select line fingers on a same level are connected together. In another embodiment, each select line finger operates as a separate word line.

Figure 4E:
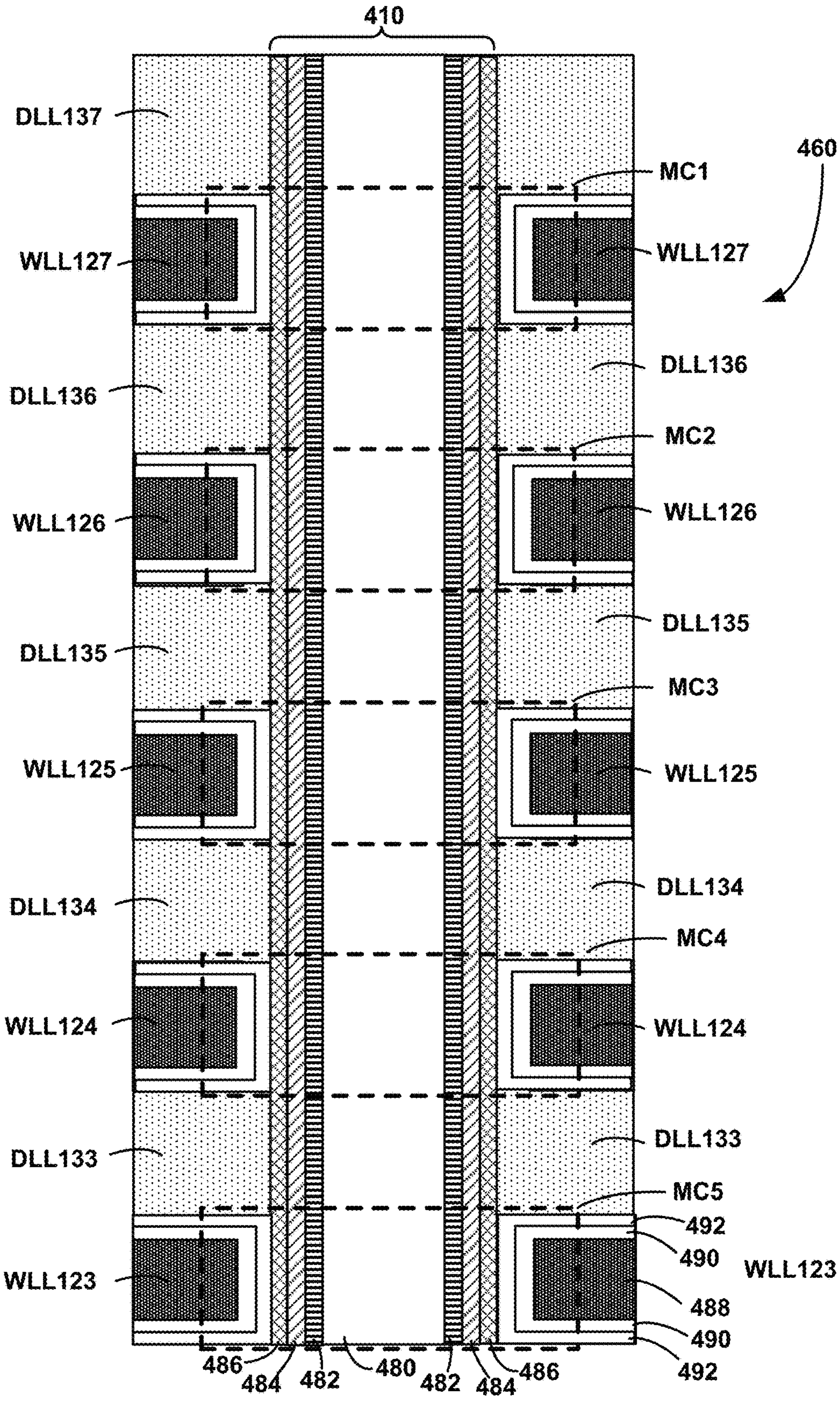
FIG. 4E is a cross sectional view of a memory hole of memory cells.

FIG. 4E depicts a cross sectional view of region 460 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
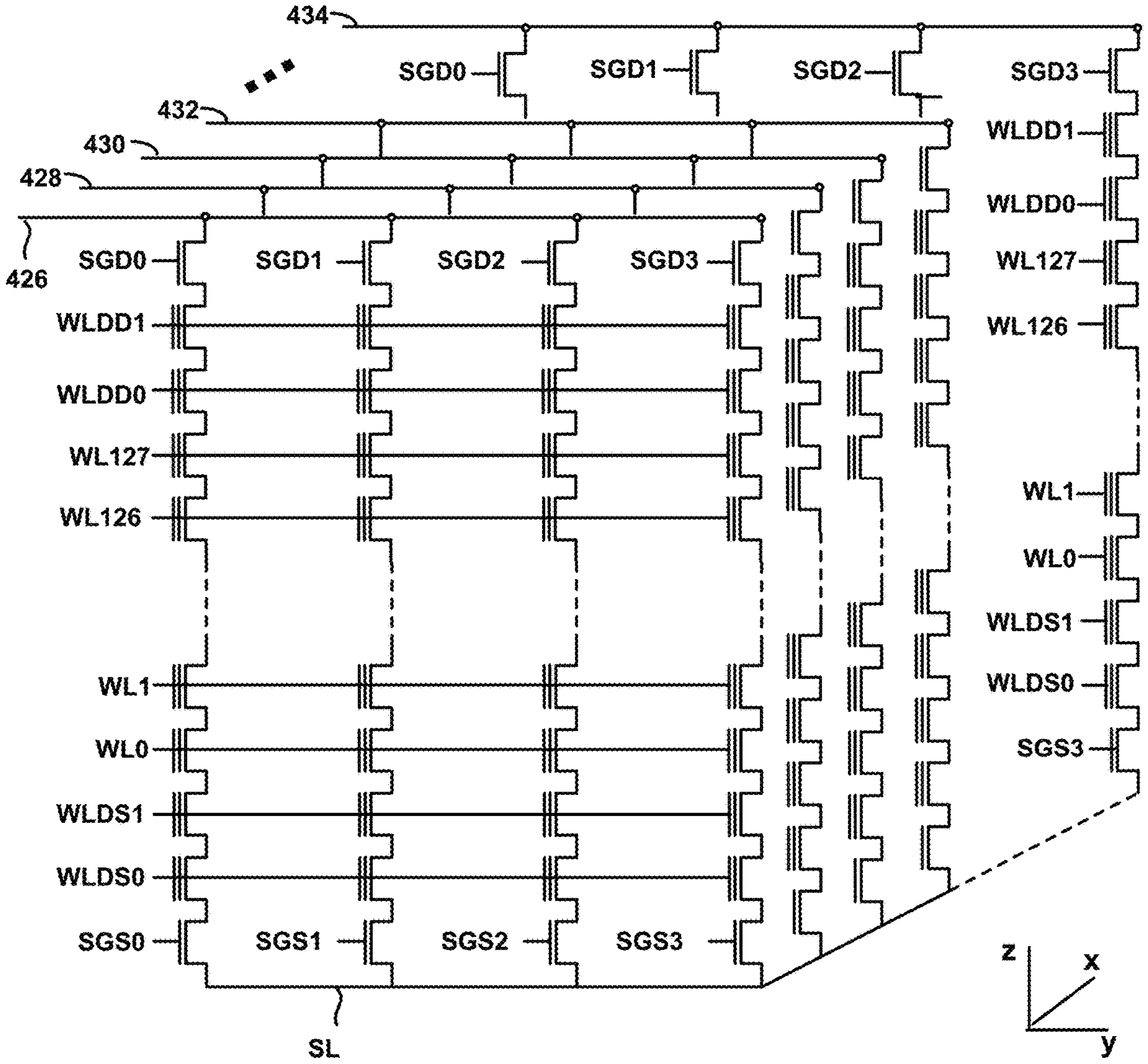
FIG. 4F is a schematic of a plurality of NAND strings in a 3D memory structure.

FIG. 4F is a schematic diagram corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Figure 4G:
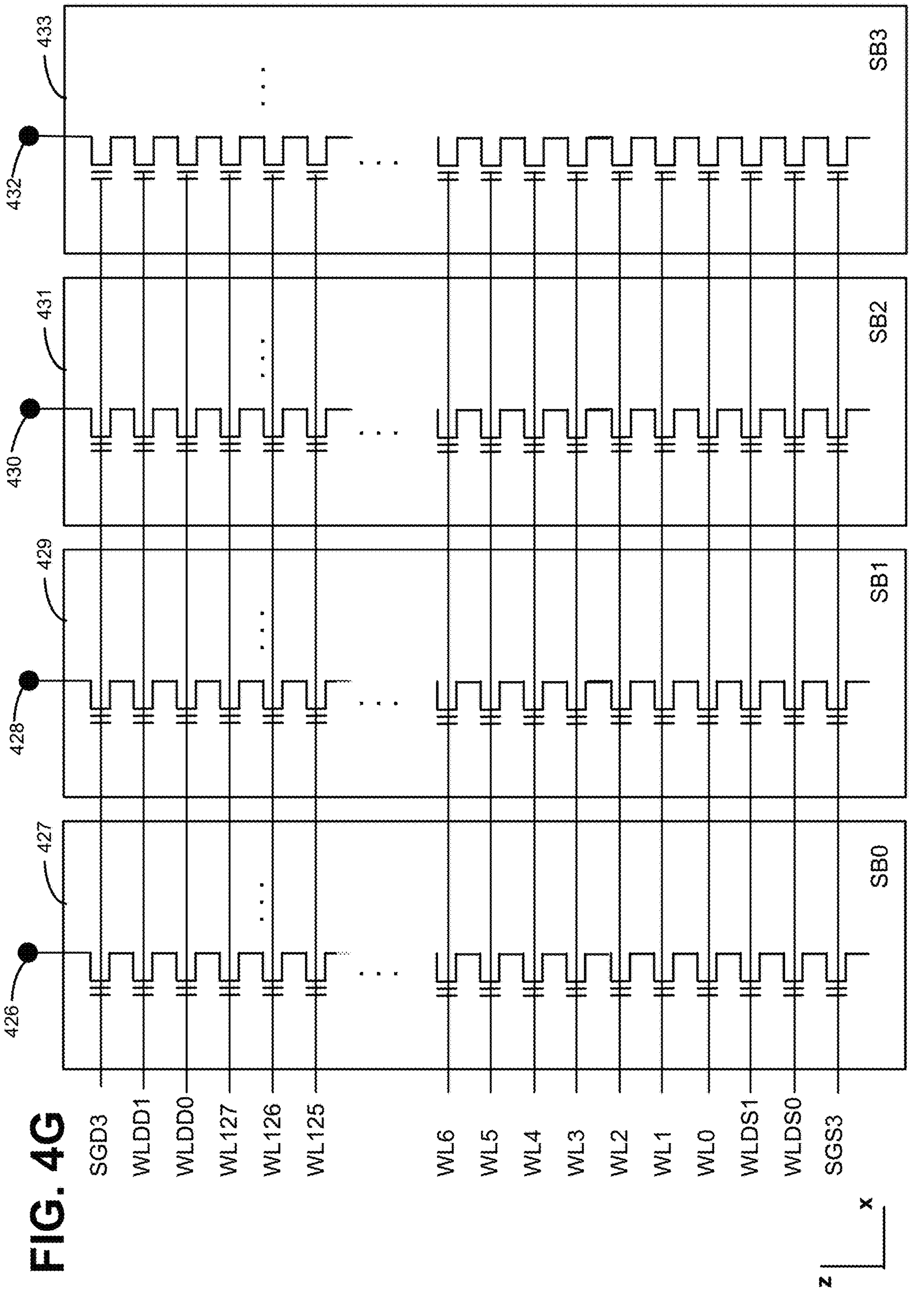
FIG. 4G is a schematic of a plurality of NAND strings in a 2D or 3D memory structure.

FIG. 4G illustrates another view of a portion of the 3D structure of FIG. 4F, along the x-z plane (i.e. along a plane shown on the right in perspective view of FIG. 4F), showing each NAND string 427, 429, 431, 433 comprises a number of memory cells connected in series between one or more drain-end select gate transistors (referred to as SGD transistors), on a drain-end of the NAND string which is connected to a bit line (bit lines 426, 428, 430, 432), and one or more source-end select gate transistors (referred to as SGS transistors), on a source-end of the NAND string, which is connected to a source line (not shown in this view). Further, the memory cells can be arranged with a common control gate line (e.g., word line) which acts a control gate. A set of word lines extends across NAND string 427, 429, 431, 433 and includes data word lines WL0-WL127 and dummy word lines WLDS0, WLDS1, WLDD0, WLDD1. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate. While FIG. 4G shows a cross section along the x-z plane of a 3D memory structure, a 2D memory structure may be similarly configured along the x-y plane (e.g. along a surface of a silicon substrate). Aspects of the present technology may be applicable to both 3D and 2D memory structures that include NAND strings or similar arrangements of data memory cells and dummy memory cells.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (e.g. as shown in FIG. 4G). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state (logic state) according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states. In a four-bit per cell memory device, there are sixteen data states, including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn. A read operation can involve reading pages of data, one at a time.

Although the example memory system of FIGS. 3-4G is a three dimensional memory structure that includes vertical NAND strings with charge-trapping material, other (2D and 3D) memory structures also can be used with the technology described herein. For example, while the structure illustrated in FIG. 4G is a cross section of a 3D memory, a 2D memory may have a similar structure that extends across the surface of a substrate (e.g. along the x-y plane instead of along the x-z plane).

Figure 4H:
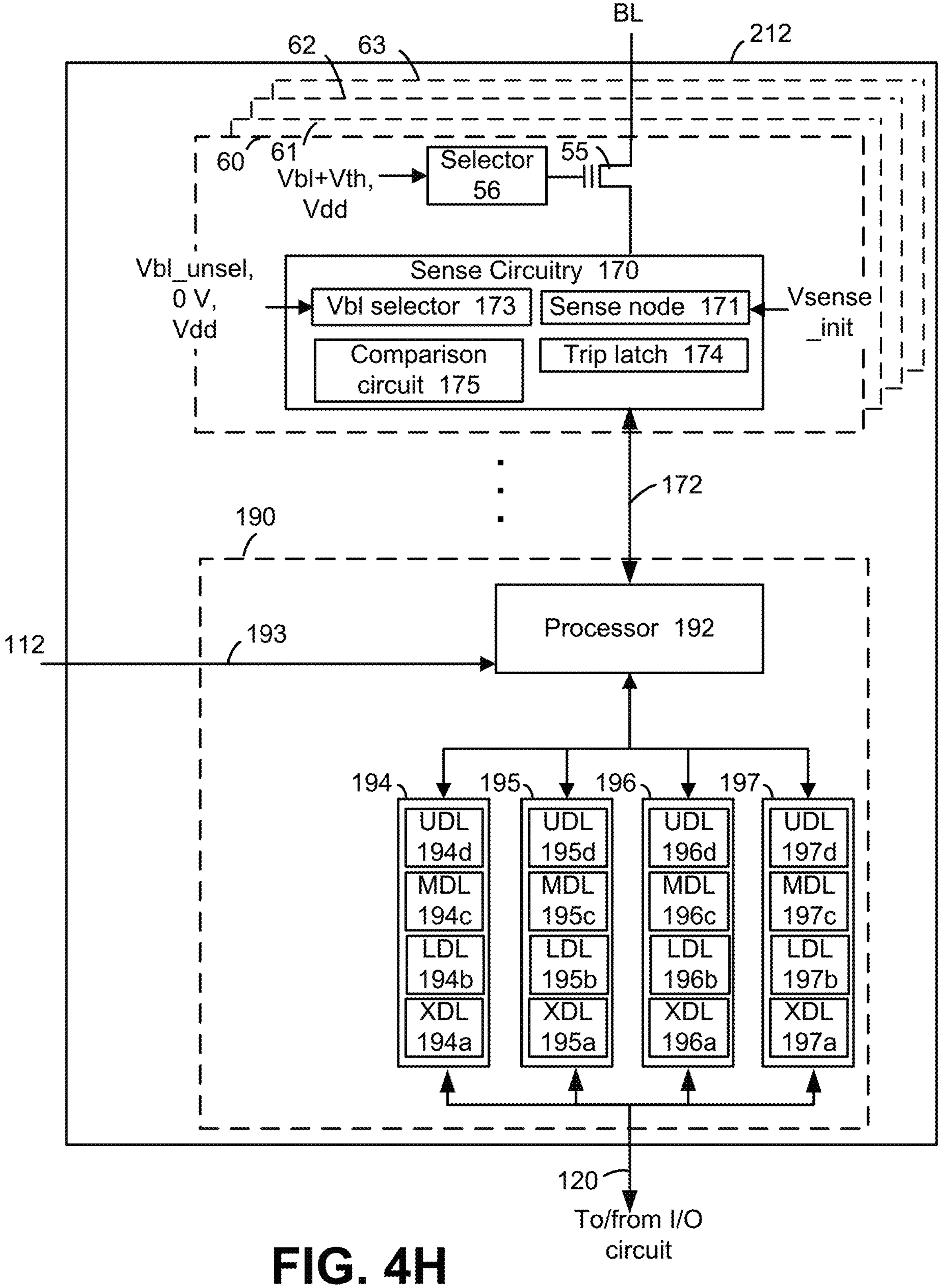
FIG. 4H illustrates circuits coupled to a bit line of a non-volatile memory structure.

FIG. 4H is a block diagram depicting one embodiment of the sense block 212 of FIG. 2. An individual sense block is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a voltage in a connected bit line is above or below a predetermined level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, or prior to sensing, the transistor 55 may be used to charge up the bit line (pre-charge the bit line) to achieve a desired bit line voltage. Thus, transistor 55 in combination with selector 56 may be considered a pre-charge circuit configured to pre-charge the plurality of bit lines to a pre-charge voltage prior to discharge (e.g. discharge for reading data states of memory cells).

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits. During sensing, the sense node 171 may be charged up to an initial voltage such as 3 V. The sense node is then connected to the bit line via the transistor 55 to charge up the bit line, and discharge of the bit line voltage is used to determine whether a memory cell is in a conductive or non-conductive state. The comparison circuit 175 is used to compare the bit line voltage to a trip voltage at a sense time (e.g. after a predetermined discharge time). If the bit line voltage discharges below the trip voltage Vtrip, the memory cell is in a conductive state and its Vth is at or below the voltage of the verification signal. If the bit line voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and a data bus 120 to/from an I/O circuit. For each NAND string, a set of data latches can be provided for storing read and write data while an additional input/output latch XDL, or data transfer latch, is provided for transferring data to/from the other latches.

For example, in a three bit per cell embodiment, three data latches LDL, MDL and XDL are provided for storing read and write data for each NAND string. LDL stores a bit for a lower page of data, MDL stores a bit for a middle page of data and UDL stores a bit for an upper page of data. For example, a set of latches 194 includes XDL 194*a*, LDL 194*b*, MDL 194*c* and UDL 194*d*. A set of latches 195 includes XDL 195*a*, LDL 195*b*, MDL 195*c* and UDL 195*d*. A set of latches 196 includes XDL 196*a*, LDL 196*b*, MDL 196*c* and UDL 196*d*. A set of latches 197 includes XDL 197*a*, LDL 197*b*, MDL 197*c* and UDL 197*d*.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory.

During reading, the operation of the system is under the control of state machine 216 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are four data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figures 5, 6:
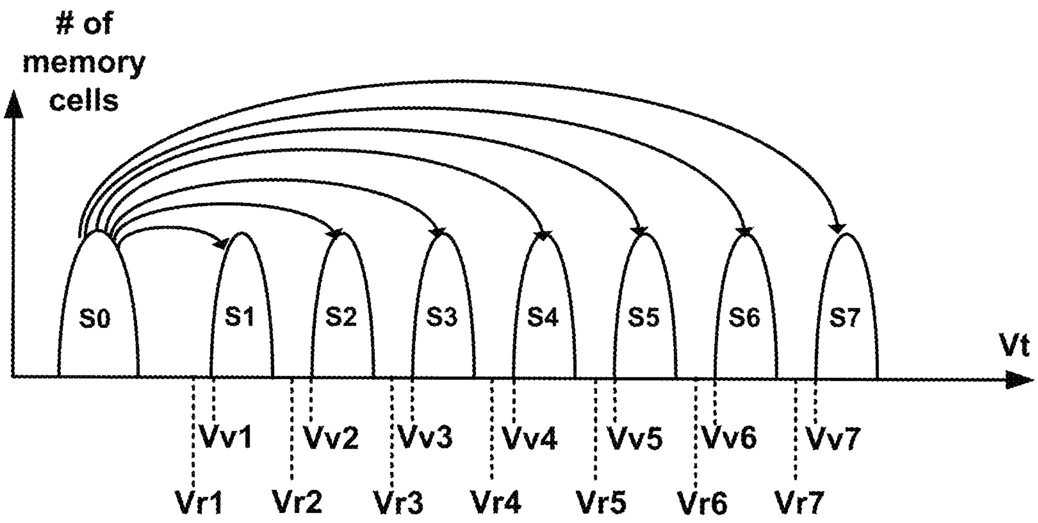
FIG. 5 depicts threshold voltage distributions.
FIG. 6 shows a table describing one example of an assignment of data values to data

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into a memory cell and the threshold voltage levels of the memory cell depends upon the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. Subsequently, when a read operation is performed, read voltages Vr1-Vr7 may be used to discriminate between memory cells in different data states.

In an embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming. The technology described herein can also be used with other types of programming in addition to full sequence programming (including, but not limited to, multiple stage/phase programming). In some embodiments, data states S1-S7 can overlap, with controller 104 (FIG. 1) relying on error correction to identify the correct data being stored.

FIG. 6 is a table describing an example assignment of data values to data states. In the table of FIG. 6, S0=111. S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are 1 when the memory cell is erased (e.g., in data state S0).

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction state (conductive or non-conductive) of a memory cell during a read or verify operation. In an example, a bit line is charged up to an initial voltage and is then discharged through a selected memory cell during a discharge time. The bit line may be coupled to a node in a current sensing module. If the selected memory cell is in a conductive state, the pre-charged bit line discharges at a relatively high rate through the NAND string into the source line so that the bit line voltage drops significantly during the discharge time. In contrast, if the selected memory cell is in a non-conductive state, the bit line voltage does not discharge, or discharges at a low rate (e.g. due to leakage current or other effect) during the discharge time.

After a predetermined discharge time period, the bit line voltage is compared to one or more predetermined reference voltages to determine the conductive state of the selected memory cell. For example, for a memory cell that stores one bit of data, if the bit line voltage is greater than a predetermined reference voltage, the memory cell is deemed to be non-conducting (e.g., OFF). Alternatively, if the bit line voltage is less than the predetermined reference voltage, the memory cell is deemed to be conducting (e.g., ON). For memory cells storing more than one bit of data, bit line voltage may be compared with more than one read voltage (e.g. compared with Vr1-Vr7 as illustrated in FIG. 5).

Figure 7A:
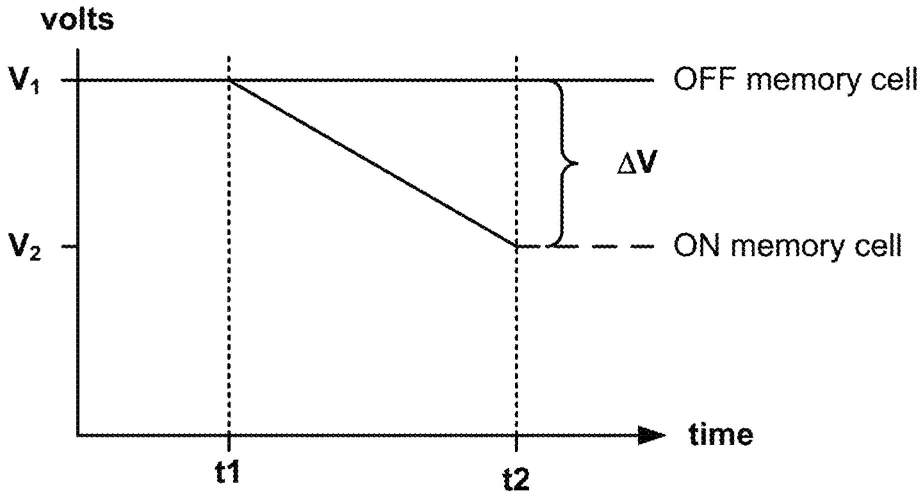
FIGS. 7A-D illustrate examples of read operations.

FIG. 7A illustrates example in which a bit line voltage is used to determine a data state of a selected memory cell (e.g. using sense blocks 212). Prior to time t1, the voltage of a bit line is $V_1$, which may be the result of pre-charging the bit line. At time t1, discharge through the selected memory cell is initiated and the bit line coupled to a selected memory cell begins to discharge. If the selected memory cell is non-conductive (e.g., OFF), the bit line discharges slowly, and the voltage of the bit line does not drop significantly so that at a sense time t2 the voltage of the sensing capacitor remains close to $V_1$. In contrast, if the selected memory cell is conductive (e.g., ON), the bit line discharges more rapidly and the voltage of the bit line drops significantly during the discharge time (from t1 to t2) so that at sense time t2, the voltage of the bit line is $V_2$. Thus, the voltage difference at sense time t2 is equal to $\Delta V = V_1 - V_2$ which provides margin for distinguishing between an OFF and an ON memory cell, which indicates the data state of the memory cell.

Figure 7B:
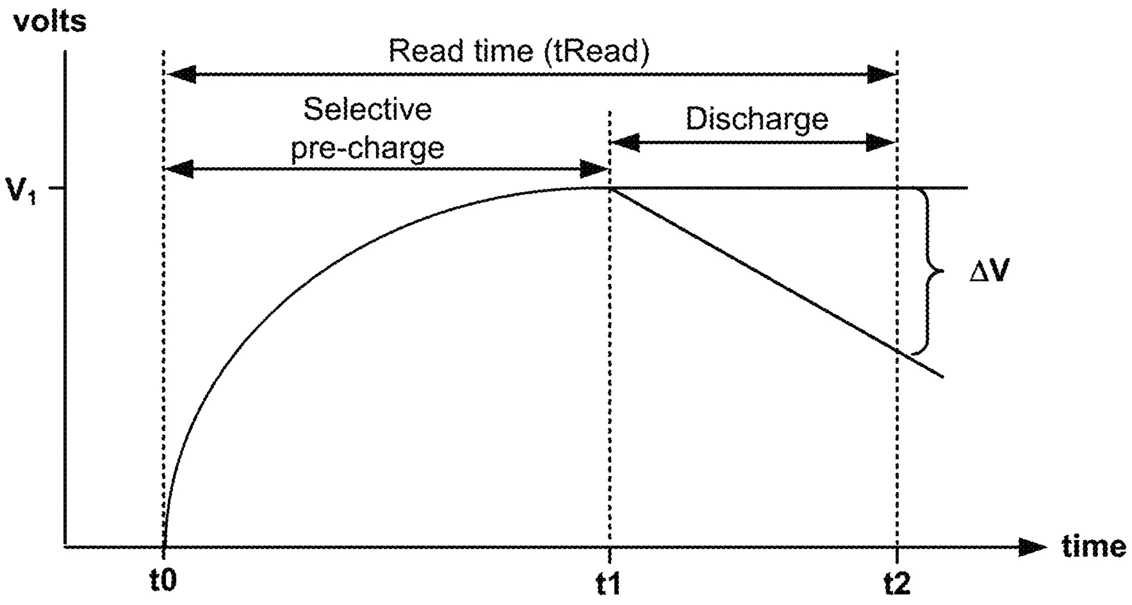

In some examples, such as illustrated in FIG. 7A, a voltage of a bit line is used to sense the data state of the cell (e.g. where a data state corresponds to a particular threshold voltage range). In general, it is desirable to reduce read time. When a bit line is brought to an initial voltage (e.g. $V_1$ in FIG. 7A) prior to any discharge used to read memory cells, this may take some significant time. Overall read time may include not only the discharge time from t1 to t2 (as illustrated in FIG. 7A) but may also include any bit line pre-charge time needed to charge up bit lines prior to initiating discharge. FIG. 7B illustrates the pre-charge time for a selected bit line from t0 to t1, during which a selected bit line is charged from a low voltage (e.g. zero volts) to a pre-charge voltage $V_1$ (e.g. 5 volts). For example, in some memory structures, such bit line pre-charging time may be about 300 ns, which may represent a significant part of overall read time.

In an example, read time is considered to extend from the time a host sends a read command with one or more addresses for data to be read until the time the data is returned to the host. Thus, in FIG. 7B, pre-charging may be initiated at time t0 in response to receipt of a read command with addresses to be read. In cases where bit lines are selectively pre-charged, the addresses must be known in order to pre-charge the corresponding bit lines. Thus, in a selective pre-charge scheme the pre-charge time is included in overall read time ($t_{Read}$) as shown in FIG. 7B. An alternative approach is to pre-charge all bit lines prior to receipt of the specific addresses to be read so that the pre-charge time is not included in the read time.

Figure 7C:
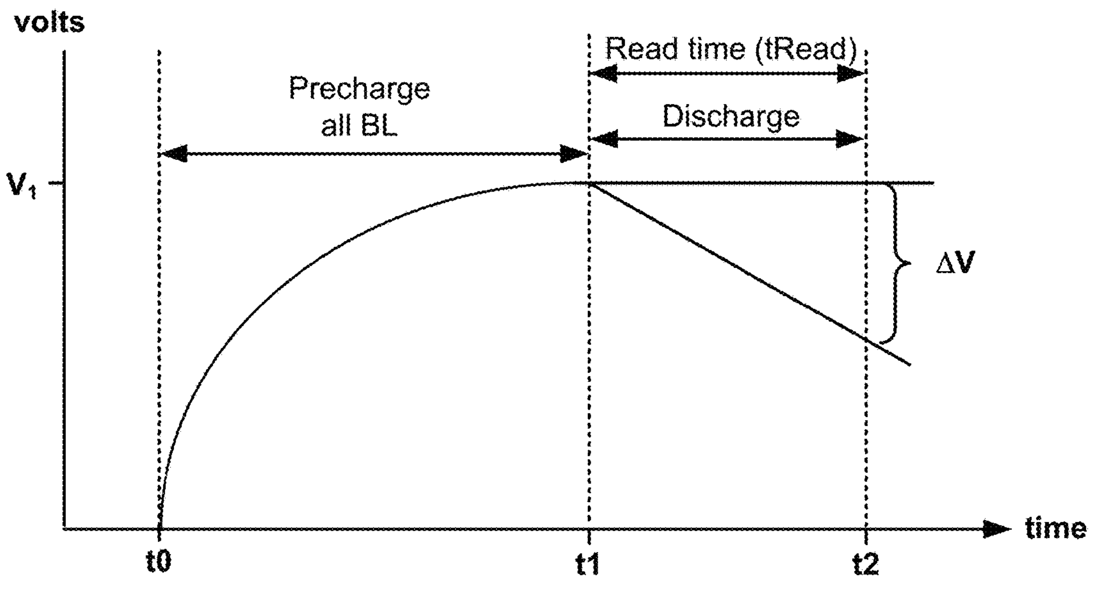

FIG. 7C shows an example in which pre-charging of all bit lines is initiated at time t0, which is prior to receipt of a specific write command with addresses of data to be read. Subsequently, when a read command and addresses are received at time t1, discharging may begin without waiting for any pre-charging of selected bit lines. Thus, the read time (tRead) includes the discharge time from t1 to t2 without the pre-charge time from t0 to t1 (which may be performed as a background operation in preparation for receipt of a write command and addresses). This may represent a significant reduction in overall read time.

One feature of charging all bit lines before knowing which bit lines are going to be selected and which are going to be unselected (e.g. before knowing the addresses associated with a read command) is that when discharging occurs during a read, there may be unselected bit lines that are charged up and that may discharge in parallel with selected bit lines.

Figure 7D:
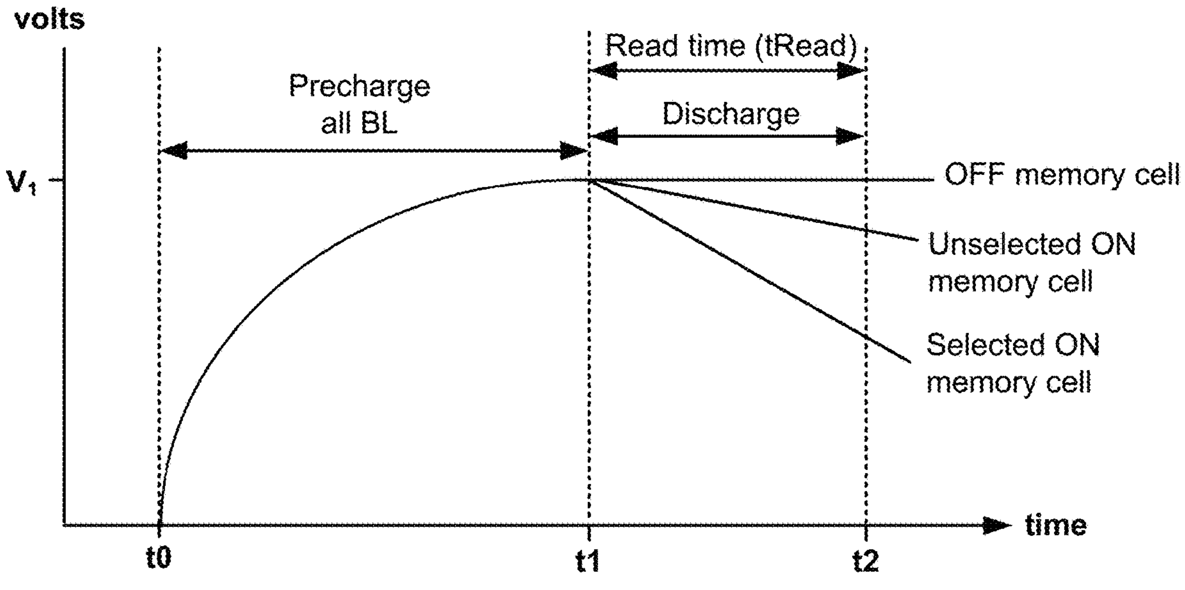

FIG. 7D illustrates an example in which all bit lines are pre-charged to V 1 and subsequently, bit lines connected to selected memory cells are discharged to read the selected memory cells. Unlike the situation of FIG. 7B, where only selected bit lines were pre-charged, here unselected bit lines are pre-charged also. Such unselected bit lines are coupled through NAND strings that share select lines and word lines with selected bit lines (e.g. as illustrated in FIG. 4G) so that they tend to discharge in parallel with selected bit lines. Discharge of unselected bit lines through unselected memory cells that are conductive (unselected ON memory cells) is illustrated in FIG. 7D and this discharge may cause noise when reading selected memory cells (e.g. some coupling may occur between unselected bit lines and selected bit lines). Such increased noise may make reading less accurate and/or require more time to achieve sufficient accuracy.

According to certain aspects of the present technology, the time saving of pre-charging all bit lines may be obtained while reducing or eliminating noise associated with discharge of unselected bit lines. In an embodiment, discharge of unselected bit lines is reduced or eliminated so that selected bit lines discharge through selected memory cells without the effects of parallel discharge of unselected bit lines (e.g. discharge indicated by "Unselected ON memory cell" in FIG. 7D may be substantially reduced or eliminated along with associated noise).

Unselected bit lines may be substantially isolated from memory cells of corresponding unselected NAND strings by appropriate configuration of dummy memory cells. Dummy memory cells may be used to selectively connect or isolate memory cells of NAND strings and corresponding bit lines. Dummy memory cells may be configured to allow a group of bit lines to be connected to memory cells of corresponding NAND strings while another group of bit lines are isolated from memory cells of corresponding NAND strings that share the same word lines and select lines.

FIG. 8A illustrates a portion of the NAND structure previously illustrated in FIGS. 4F-G that may be configured to implement aspects of the present technology and reduce or eliminate noise caused by discharge of unselected bit lines that are pre-charged prior to reading. FIG. 8A includes portions of dummy word lines WLDD1 and WLDD0 at the drain end of NAND strings 802, 804 where they couple through select transistors 806, 808, to bit lines BL0 and BL1 (which may be any two bit lines, e.g. bit lines 426 and 428 illustrated in FIG. 4G). Dummy memory cells 810, 812 are formed where dummy word lines WLDD0 and WLDD1 respectively intersect NAND string 802. Dummy memory cells 814, 816 are formed where dummy word lines WLDD0 and WLDD1 respectively intersect NAND string 804. By appropriate configuration of dummy memory cells 810, 812, 814, 816, in combination with appropriate voltages on WLDD0, WLDD1, bit lines BL0, BL1 may be coupled to, or substantially isolated from respective data memory cells 818, 820 (and additional memory cells of NAND strings 802, 804, not shown in this view). It will be understood that "substantially isolated" may refer to a situation in which some leakage current or low level of electrical connection exists, and that complete isolation is not required to achieve advantages offered by the present technology.

FIG. 8B shows an example of how threshold voltages of dummy memory cells 810, 812, 814, 816 may be configured to facilitate selective electrical coupling/isolation of bit lines. It can be seen that dummy memory cells 810, 812 of NAND string 802 have a different pattern of threshold voltages to dummy memory cells 814, 816 of NAND string 804. In NAND string 804, dummy memory cell 814, which is connected to WLDD0 has a low threshold voltage, while dummy memory cell 816, which is connected to WLDD1 has a high threshold voltage. In contrast, in NAND string 802, dummy memory cell 810, which is connected to WLDD0 has a high threshold voltage, while dummy memory cell 812, which is connected to WLDD1 has a low threshold voltage. The terms "low" and "high" are used here to describe threshold voltages with respect to each other and not to signify a particular threshold voltage range. Thus, dummy memory cells 812, 814 have some "low" threshold voltages that are lower than those of dummy memory cells 810, 816. Dummy memory cells 812 and 814 may have the same low threshold voltage or different low threshold voltages. Similarly, dummy memory cells 810 and 816 may have the same high threshold voltage or different high threshold voltages.

Different voltages may be selected as the "high" and "low" threshold voltages or threshold voltage ranges for dummy memory cells. In general, these voltages are sufficiently different so that voltage between the low threshold voltage and the high threshold voltage, when applied to a corresponding word line will turn on any dummy memory cells with the high threshold voltage without turning on any dummy memory cells with the low threshold voltage (e.g. there is a sufficient voltage range between high threshold voltage and low threshold voltage to allow reliable selective turning on of only dummy memory cells with a high threshold voltage along a given dummy word line). By applying appropriate dummy word line voltage schemes that include such a low voltage in combination with a higher voltage that is sufficient to turn on dummy memory cells with either a low or high threshold voltage (e.g. higher than the high threshold voltage), different bit lines may be isolated from memory cells of their respective NAND strings.

FIGS. 8C-D include tables illustrating two different dummy word line voltage schemes and how they are used with dummy memory cells configured as shown in FIG. 8B to selectively isolate bit lines. FIG. 8C illustrates a first dummy word line voltage scheme to turn on all dummy memory cells of NAND string 802 so that corresponding bit line BL0 is electrically connected to memory cells (e.g. memory cell 818) of NAND string 802 without turning on all dummy memory cells of NAND string 804 so that corresponding bit line BL1 is electrically isolated from memory cells (e.g. memory cell 820) of NAND string 804. In this scheme, a high voltage is applied on WLDD0, which turns on dummy memory cells 810 and 814 (configured with high and low threshold voltages respectively). A low voltage is applied on WLDD1, which turns on dummy memory cell 812 (configured with a low threshold voltage) without turning on dummy memory cell 816 (configured with a high threshold voltage). This results in BL0 being electrically connected while BL1 is electrically isolated from memory cells of corresponding NAND strings as indicated in the bottom line of the table.

FIG. 8D illustrates a second dummy word line voltage scheme to turn on all dummy memory cells of NAND string 804 so that corresponding bit line BL1 is electrically connected to memory cells (e.g. memory cell 820) of NAND string 804 without turning on all dummy memory cells of NAND string 802 so that corresponding bit line BL0 is electrically isolated from memory cells (e.g. memory cell 818) of NAND string 802. In this scheme, a high voltage is applied on WLDD1, which turns on dummy memory cells 812 and 816 (configured with low and high threshold voltages respectively). A low voltage is applied on WLDD0, which turns on dummy memory cell 814 (configured with a low threshold voltage) without turning on dummy memory cell 810 (configured with a high threshold voltage). This results in BL1 being electrically connected while BL0 is isolated from memory cells of corresponding NAND strings as indicated in the bottom line of the table (BL-cell).

While two bit lines are illustrated in the example of FIGS. 8A-D, it will be understood that the principle illustrated may be applied to any number of bit lines. Dummy memory cells of any number of bit lines may be configured with a given pattern of threshold voltages. For example, the example of FIGS. 8A-D may be extended to any number of bit lines and corresponding NAND strings, with dummy memory cells connected to even-numbered bit lines configured like dummy memory cells 810, 812 and dummy memory cells connected to odd-numbered bit lines configured like dummy memory cells 814, 816. Thus, NAND strings may divided into a first group of NAND strings including dummy memory cells with a first pattern of threshold voltages and a second group of NAND strings including dummy memory cells with a second pattern of threshold voltages so that bit lines associated with each group can be selectively electrically connected or isolated. This allows isolation of odd numbered bit lines while even numbered bit lines discharge for reading and allows isolation of even numbered bit lines while odd numbered bit lines discharge for reading.

Figure 8E:
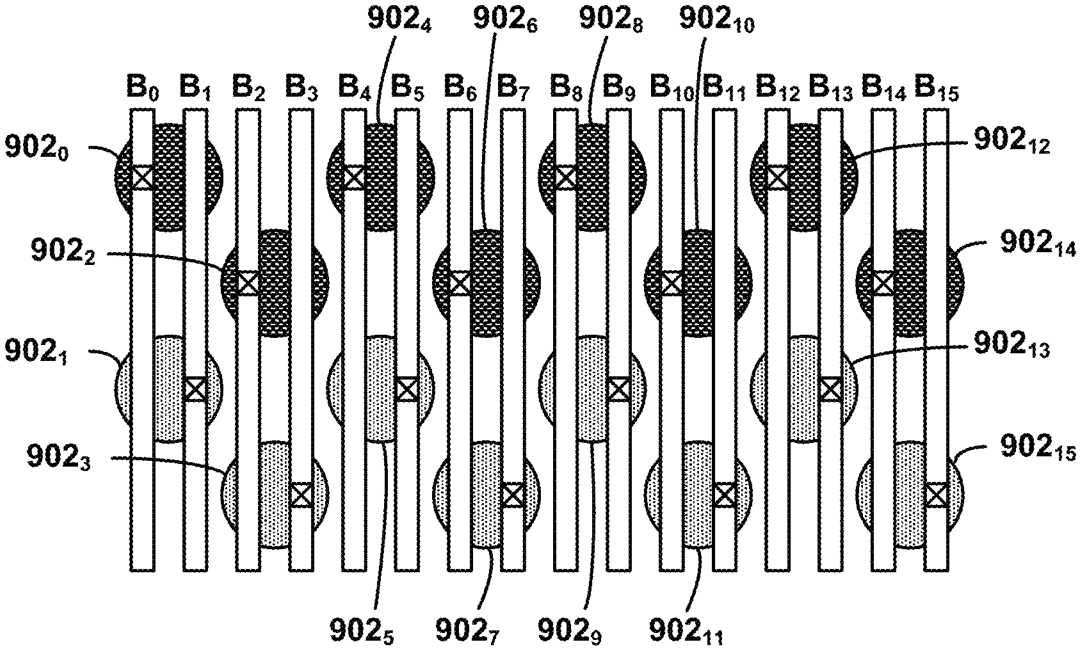

FIG. 8E shows an example of two groups of bit lines that may be separately isolated or connected. FIG. 8E depicts a top-down view of an embodiment of a portion of a three-dimensional memory array that includes sixteen bit lines B0, B1, B2, . . . B15 and sixteen memory holes $\mathbf{902}_0$, $\mathbf{902}_1$, $\mathbf{902}_2$, . . . , $\mathbf{902}_{15}$, each including a NAND string of memory cells, with bit lines B0, B1, B2, . . . B15 (and corresponding memory holes $\mathbf{902}_0$, $\mathbf{902}_1$, $\mathbf{902}_2$, . . . , $\mathbf{902}_{15}$) divided into two groups. In particular, bit lines B0, B2, B4, B6, B8, B10, B12 and B14 are classified as "even" bit lines, which form a first group, and bit lines B1, B3, B5, B7, B9, B11, B13 and B15 are classified as "odd" bit lines, which form a second group.

In an embodiment of "Half Bit Line" HBL shielded voltage sensing, in a first (even) read interval, each of even bit lines B0, B2, B4, B6, B8, B10, B12 and B14 is coupled to a corresponding one of eight sense amplifiers and the selected memory cells in even memory holes $\mathbf{902}_0$, $\mathbf{902}_2$, $\mathbf{902}_4$, $\mathbf{902}_6$, $\mathbf{902}_8$, $\mathbf{902}_{10}$, $\mathbf{902}_{12}$ and $\mathbf{902}_{14}$ are read. Then, in a second (odd) read interval, each of odd bit lines B1, B3, B5, B7, B9, B11, B13 and B15 is coupled to a corresponding one of the eight sense amplifiers and the selected memory cells in odd memory holes $\mathbf{902}_1$, $\mathbf{902}_3$, $\mathbf{902}_5$, $\mathbf{902}_7$, $\mathbf{902}_9$, $\mathbf{902}_{11}$, $\mathbf{902}_{13}$ and $\mathbf{902}_{15}$ are read. Both odd and even groups may be pre-charged together and selective isolation may be used to ensure that unselected bit lines do not discharge during reading of memory cells coupled to selected bit lines.

The number of groups of NAND strings that may be configured with different patterns of threshold voltages is not limited to two. Where NAND strings include more than two dummy memory cells, more than two groups may have different patterns of threshold voltage that allow selective isolation of bit lines of each group. For example, NAND strings of an individual group may have the same dummy memory cell configured with a low threshold voltage (i.e. they may all have a low threshold voltage dummy memory cell coupled to the same dummy word line so that they may be selected together without selecting NAND strings of other groups). Each such group may have a different dummy memory cell configured with a low threshold voltage (e.g. one group has a low threshold voltage dummy memory cells along a first dummy word line, another group has low threshold voltage dummy memory cells along a second dummy word line, another has low threshold voltage dummy memory cells along a third dummy word line, and so on). While dummy memory cells at drain ends of NAND strings are used in the present example, dummy memory cells at other locations may also be used (e.g. at source ends of NAND strings, or at one or more intermediate locations). Because memory holes have some capacitance that may affect bit line discharge, it may be preferable to isolate bit lines at the drain end so that the bit lines remain isolated from memory cells and memory holes.

Figures 9A, 9B:
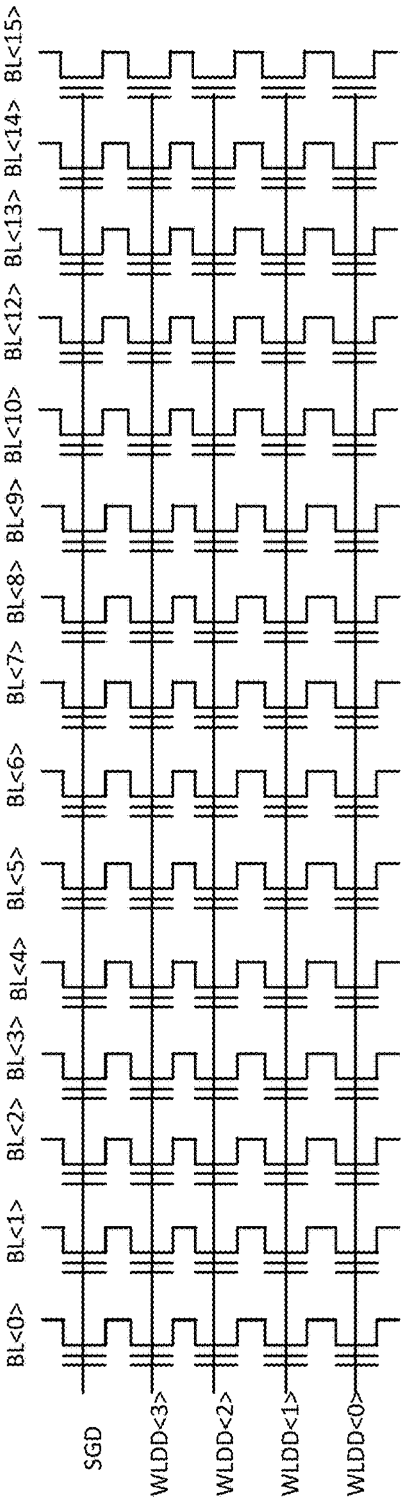

FIG. 9A shows a schematic illustration of an example of a portion of a NAND memory structure (either 2D or 3D) that includes sixteen bit lines (BL<0> to BL<15>) and four dummy word lines (WLDD<0> to WLDD<3>). Four dummy word lines provide the ability to implement a range of different patterns of threshold voltage that may be used with a range of different dummy word line voltage schemes. For example, more than two groups of NAND strings may be configured with more than two patterns of threshold voltages.

FIG. 9B shows an example of threshold voltage patterns that may be applied to groups of NAND strings in the structure of FIG. 9A. Each entry in the table of FIG. 9B represents threshold voltage of a corresponding dummy memory cell at the intersection of the bit line and dummy word line indicated. Some dummy memory cells are configured with a low threshold voltage of 3 volts while other dummy memory cells are configured with a high threshold voltage of 5 volts.

A first group of NAND strings (NAND strings coupled to bit lines BL<0>, BL<5>, BL<8> and BL<13> include dummy memory cells with a first pattern of threshold voltages. The first pattern of threshold voltages includes dummy memory cells coupled to a first dummy word line (WLDD<0>) having a first threshold voltage (3 volts) and dummy memory cells coupled to other dummy word lines (WLDD<1> to WLDD<3>) having a second threshold voltage (5 volts) that is higher than the first threshold voltage. A second group of NAND strings (NAND strings coupled to bit lines BL<1>, BL<4>, BL<9> and BL<12> include dummy memory cells with a second pattern of threshold voltages. The second pattern of threshold voltages includes dummy memory cells coupled to a second dummy word line (WLDD<1>) having a first threshold voltage (3 volts) and dummy memory cells coupled to other dummy word lines (WLDD<0>, WLDD<2> and WLDD<3>) having a second threshold voltage (5 volts) that is higher than the first threshold voltage. A third group of NAND strings (NAND strings coupled to bit lines BL<2>, BL<7>, BL<10> and BL<15> include dummy memory cells with a third pattern of threshold voltages. The third pattern of threshold voltages includes dummy memory cells coupled to a third dummy word line (WLDD<2>) having a first threshold voltage (3 volts) and dummy memory cells coupled to other dummy word lines (WLDD<0>, WLDD<1> and WLDD<3>) having a second threshold voltage (5 volts) that is higher than the first threshold voltage. A fourth group of NAND strings (NAND strings coupled to bit lines BL<3>, BL<6>, BL<11> and BL<14> include dummy memory cells with a fourth pattern of threshold voltages. The fourth pattern of threshold voltages includes dummy memory cells coupled to a fourth dummy word line (WLDD<3>) having a first threshold voltage (3 volts) and dummy memory cells coupled to other dummy word lines (WLDD<0> to WLDD<2>) having a second threshold voltage (5 volts) that is higher than the first threshold voltage.

FIG. 9C shows a table that indicates which NAND strings are included in each group as discussed above (NAND strings are indicated by corresponding bit lines). The first group of NAND strings includes NAND strings coupled to bit lines BL<0>, BL<5>, BL<8> and BL<13>. The second group of NAND strings includes NAND strings coupled to bit lines BL<1>, BL<4>, BL<9> and BL<12>. The third group of NAND strings includes NAND strings coupled to bit lines BL<2>, BL<7>, BL<10> and BL<15>. The fourth group of NAND strings includes NAND strings coupled to bit lines BL<3>, BL<6>, BL<11> and BL<14>. It will be understood that additional bit lines may be included in each of these groups (e.g. there may be additional bit lines beyond BL<15> that are similarly configured to be in different groups).

FIG. 9C also shows, for each group of NAND strings and bit lines, a corresponding dummy word line voltage scheme including dummy word line voltages for WLDD<0> to WLDD<3> that may be used to select a corresponding group. To select the first group, a first dummy word line voltage scheme applies a low voltage (4 volts in this example) to dummy word line WLDD<0> and applies a high voltage (6 volts in this example) to other dummy word lines. Applying 4 volts to WLDD<0> turns on dummy memory cells along WLDD<0> of the first group that have a threshold voltage of 3 volts and does not turn dummy memory cells of other groups that have a threshold voltage of 5 volts so that bit lines of the first group are electrically connected to memory cells of corresponding NAND strings while bit lines of other groups are electrically isolated from memory cells of their corresponding NAND strings. Dummy word lines other than WLDD<0> receive 6 volts so that all dummy memory cells along dummy word lines other than WLDD<0> are turned on. To select the second group, a second dummy word line voltage scheme applies a low voltage (4 volts in this example) to dummy word line WLDD<1> and applies a high voltage (6 volts in this example) to other dummy word lines. Applying 4 volts to WLDD<1> turns on dummy memory cells along WLDD<1> of the second group that have a threshold voltage of 3 volts and does not turn dummy memory cells of other groups that have a threshold voltage of 5 volts so that bit lines of the second group are electrically connected to memory cells of corresponding NAND strings while bit lines of other groups are electrically isolated from memory cells of their corresponding NAND strings. Dummy word lines other than WLDD<1> receive 6 volts so that all dummy memory cells along dummy word lines other than WLDD<1> are turned on. To select the third group, a third dummy word line voltage scheme applies a low voltage (4 volts in this example) to dummy word line WLDD<2> and applies a high voltage (6 volts in this example) to other dummy word lines. Applying 4 volts to WLDD<2> turns on dummy memory cells along WLDD<2> of the first group that have a threshold voltage of 3 volts and does not turn dummy memory cells of other groups that have a threshold voltage of 5 volts so that bit lines of the third group are electrically connected to memory cells of corresponding NAND strings while bit lines of other groups are electrically isolated from memory cells of their corresponding NAND strings. Dummy word lines other than WLDD<2> receive 6 volts so that all dummy memory cells along dummy word lines other than WLDD<2> are turned on. To select the fourth group, a fourth dummy word line voltage scheme applies a low voltage (4 volts in this example) to dummy word line WLDD<3> and applies a high voltage (6 volts in this example) to other dummy word lines. Applying 4 volts to WLDD<3> turns on dummy memory cells along WLDD<3> of the fourth group that have a threshold voltage of 3 volts and does not turn dummy memory cells of other groups that have a threshold voltage of 5 volts so that bit lines of the fourth group are electrically connected to memory cells of corresponding NAND strings while bit lines of other groups are electrically isolated from memory cells of their corresponding NAND strings. Dummy word lines other than WLDD<3> receive 6 volts so that all dummy memory cells along dummy word lines other than WLDD<3> are turned on. Dummy memory cells configured with different threshold voltages (e.g. as illustrated in FIG. 9B or 8B) may individually couple or isolate a group of NAND strings and corresponding bit lines and may be considered an example of means for individually coupling or isolating a group of NAND strings and corresponding bit lines.

Different physical memory structures may be appropriate for different grouping of NAND strings. For example, in some memory structures, two groups of NAND strings may be sufficient and dummy memory cells may be configured as illustrated in FIGS. 8B and 8E for use with dummy word line voltage schemes illustrated in FIGS. 8C and 8D so that two groups of NAND strings can be separately isolated/selected.

Figures 10A, 10B:
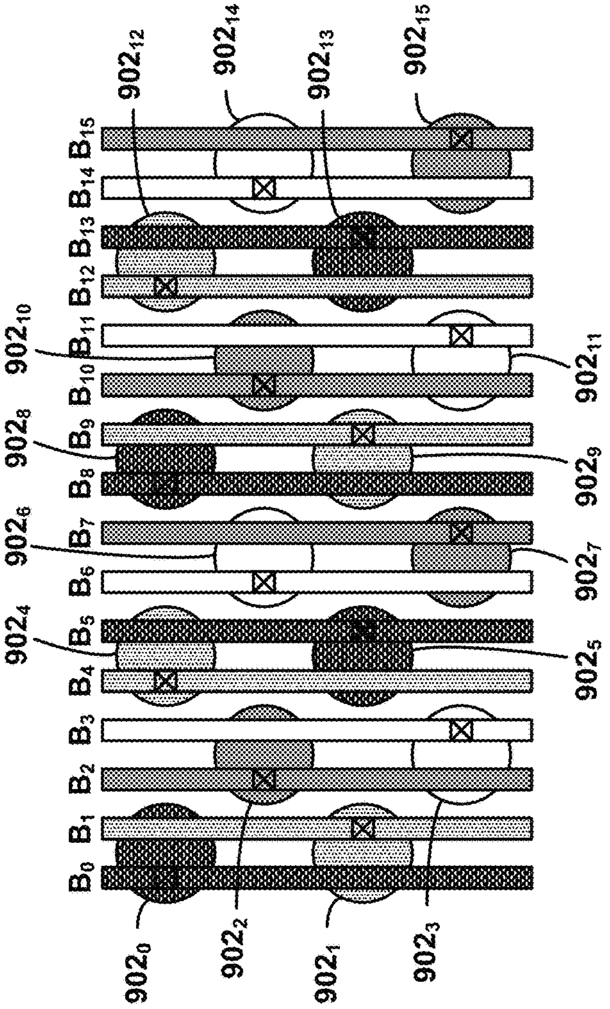
FIGS. 10A-B illustrate an example of four groups of bit lines and coupling to corresponding NAND strings and memory holes in a 3D memory structure.

The examples described with respect to FIGS. 9A-C that divide bit lines and NAND strings into four groups may be appropriate for use with technology described as "quarter-bit line (QBL) voltage sensing" which is illustrated in FIGS. 10A-B. FIG. 10A depicts a top-down view of an embodiment of a portion of a three-dimensional memory array that includes sixteen bit lines $B_0$, $B_1$, $B_2$, . . . $B_{15}$ and sixteen memory holes 902$_0$, 902$_1$, 902$_2$, . . . , 902$_{15}$, each including a NAND string of memory cells. In an embodiment, each of memory holes 902$_0$, 902$_1$, 902$_2$, . . . , 902$_{15}$ is associated with and coupled to a corresponding one of bit lines $B_0$, $B_1$, $B_2$, . . . $B_{15}$. Bit lines $B_0$, $B_1$, $B_2$, . . . , $B_{15}$, (and associated and memory holes 902$_0$, 902$_1$, 902$_2$, . . . , 902$_{15}$) are conceptually divided into four groups. In particular, bit lines $B_0$, $B_5$, $B_8$ and $B_{13}$ are classified herein as "first quarter bit lines," bit lines $B_1$, $B_4$, $B_9$ and $B_{12}$ are classified herein as "second quarter bit lines," bit lines $B_2$, $B_7$, $B_{10}$ and $B_{15}$ are classified herein as "third quarter bit lines," and bit lines $B_3$, $B_6$, $B_{11}$ and $B_{14}$ are classified herein as "fourth quarter bit lines."

Similarly, memory holes 902$_0$, 902$_5$, 902$_8$ and 902$_{13}$ are classified herein as "first quarter memory holes," memory holes 902$_1$, 902$_4$, 902$_9$ and 902$_{12}$ are classified herein as "second quarter memory holes," memory holes 902$_2$, 902$_7$, 902$_{10}$ and 902$_{15}$ are classified herein as "third quarter memory holes," and memory holes 902$_3$, 902$_6$, 902$_{11}$ and 902$_{14}$ are classified herein as "fourth quarter memory holes."

Referring again to FIG. 10A, the memory holes in each segment are separated from one another by an intervening memory hole from outside the segment. For example, each of first quarter memory holes 902$_0$, 902$_5$, 902$_8$ and 902$_{13}$ are separated from one another by at least one intervening memory hole not included in the segment of first quarter memory holes 902$_0$, 902$_5$, 902$_8$ and 902$_{13}$. In particular, first quarter memory holes 902$_0$ and 902$_5$ are separated by third quarter memory hole 902$_2$, first quarter memory holes 902$_5$ and 902$_8$ are separated by fourth quarter memory hole 902$_6$, and first quarter memory holes 902$_8$ and 902$_{13}$ are separated by third quarter memory hole 902$_{10}$. Without wanting to be bound by any particular theory, it is believed that parasitic capacitance between first quarter memory holes 902$_0$, 902$_5$, 902$_8$ and 902$_{13}$ is much lower than parasitic capacitance between adjacent selected memory holes in an HBL shielded voltage sensing technique (e.g., parasitic capacitances $Cp_{02}$, $Cp_{24}$, $Cp_{13}$ and $Cp_{35}$ in FIG. 9C), and thus during the first quarter read interval the effects of parasitic capacitive coupling are substantially reduced.

In addition, each of second quarter memory holes 902$_1$, 902$_4$, 902$_9$ and 902$_{12}$ are separated from one another by at least one intervening memory hole not included in the segment of second quarter memory holes 902$_1$, 902$_4$, 902$_9$ and 902$_{12}$. In particular, second quarter memory holes 902$_1$ and 902$_4$ are separated by third quarter memory hole 902$_2$, second quarter memory holes 902$_4$ and 902$_9$ are separated by fourth quarter memory hole 902$_6$, and second quarter memory holes 902$_9$ and 902$_{12}$ are separated by third quarter memory hole 902$_{10}$. Without wanting to be bound by any particular theory, it is believed that parasitic capacitance between second quarter memory holes 902$_1$, 902$_4$, 902$_9$ and 902$_{12}$ is much lower than parasitic capacitance between adjacent selected memory holes in an HBL shielded voltage sensing technique (e.g., parasitic capacitances $Cp_{02}$, $Cp_{24}$, $Cp_{13}$ and $Cp_{35}$ in FIG. 9C), and thus during the second quarter read interval the effects of parasitic capacitive coupling are substantially reduced.

Further, each of third quarter memory holes 902$_2$, 902$_7$, 902$_{10}$ and 902$_{15}$ are separated from one another by at least one intervening memory hole not included in the segment of third quarter memory holes 902$_2$, 902$_7$, 902$_{10}$ and 902$_{15}$. In particular, third quarter memory holes 902$_2$ and 902$_7$ are separated by first quarter memory hole 902$_5$, third quarter memory holes 902$_7$ and 902$_{10}$ are separated by second quarter memory hole 902$_9$, and third quarter memory holes 902$_{10}$ and 902$_{15}$ are separated by first quarter memory hole 902$_{13}$. Without wanting to be bound by any particular theory, it is believed that parasitic capacitance between third quarter memory holes 902$_2$, 902$_7$, 902$_{10}$ and 902$_{15}$ is much lower than parasitic capacitance between adjacent selected memory holes in an HBL shielded voltage sensing technique (e.g., parasitic capacitances $Cp_{02}$, $Cp_{24}$, $Cp_{13}$ and $Cp_{35}$ in FIG. 9C), and thus during the third quarter read interval the effects of parasitic capacitive coupling are substantially reduced.

Moreover, each of fourth quarter memory holes 902$_3$, 902$_6$, 902$_{11}$ and 902$_{14}$ are separated from one another by at least one intervening memory hole not included in the segment of fourth quarter memory holes 902$_3$, 902$_6$, 902$_{11}$ and 902$_{14}$. In particular, fourth quarter memory holes 902$_3$ and 902$_6$ are separated by first quarter memory hole 902$_5$, fourth quarter memory holes 902$_6$ and 902$_{11}$ are separated by second quarter memory hole 902$_9$, and fourth quarter memory holes 902$_{11}$ and 902$_{14}$ are separated by first quarter memory hole 902$_{13}$. Without wanting to be bound by any particular theory, it is believed that parasitic capacitance between fourth quarter memory holes 902$_3$, 902$_6$, 902$_{11}$ and 902$_{14}$ is much lower than parasitic capacitance between adjacent selected memory holes in an HBL shielded voltage sensing technique (e.g., parasitic capacitances $Cp_{02}$, $Cp_{24}$, $Cp_{13}$ and $Cp_{35}$ in FIG. 9C), and thus during the fourth quarter read interval the effects of parasitic capacitive coupling are substantially reduced.

Without wanting to be bound by any particular theory, it is believed that parasitic capacitive coupling between selected memory columns in the QBL voltage sensing technique described above is much lower than that of previously known HBL shielded voltage sensing techniques such as those described above.

FIG. 10B illustrates grouping of bit lines so that data read from memory cells of a corresponding group of NAND strings form a page (e.g. data read from memory cells of a first group of NAND strings connected to bit lines $B_0$, $B_5$, $B_8$, $B_{13}$ form a first page, data read from memory cells of a second group of NAND strings connected to bit lines $B_1$, $B_4$, $B_9$, $B_{12}$ form a second page, and so on). FIG. 10B also illustrates sharing of sense amplifiers SA0 to SA3 in this scheme, which efficiently shares each sense amplifier between four bit lines, each in a different group, with each group separately selected. As previously described, when any given group of bit lines is connected to sense amplifiers during discharge through memory cells, other unselected groups of bit lines may be isolated from corresponding memory cells so that noise is reduced and a high-quality, low-noise read may be obtained in a relatively short time period. While the grouping of NAND strings illustrated in FIG. 10B (and illustrated in FIG. 9B) may be appropriate for the physical arrangement of memory holes shown in FIG. 10A, other groupings may be appropriate for other physical arrangements of memory holes and the present examples are for illustration of the concepts described and are not intended to be limiting. While the above examples refer to two groups and four groups of bit lines and NAND strings, three, five, or more such groups may be appropriate in some cases.

Figure 11:
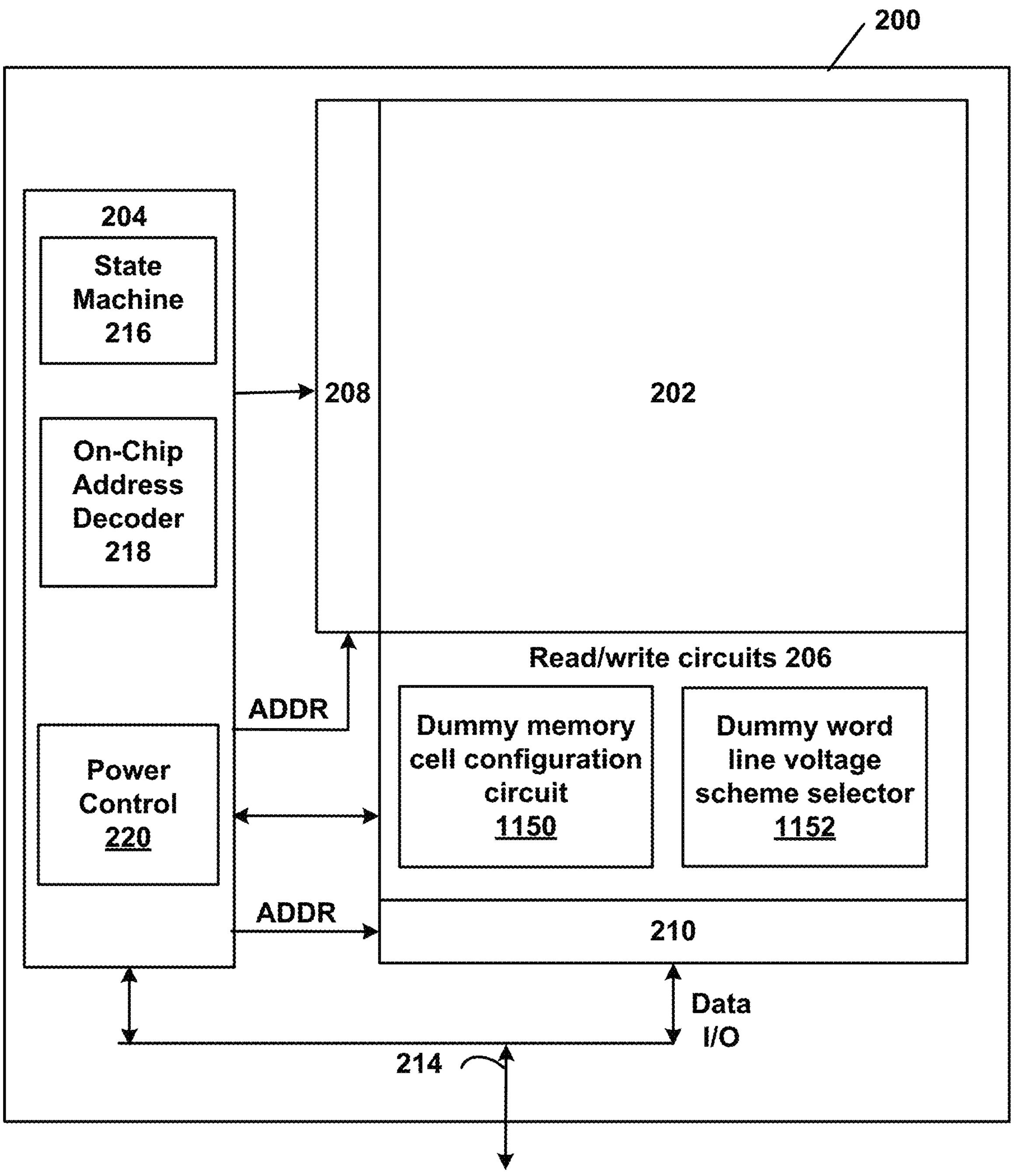
FIG. 11 illustrates an example of components for implementing dummy word line configuration and operation.

FIG. 11 illustrates an example of memory die 200 adapted to implement aspects of the present technology including selective isolation and connection of bit lines as described with respect to FIGS. 8A-9C. For example, read/write circuits 206 are adapted to include dummy memory cell configuration circuit 1150, which configures dummy memory cells to have a desired pattern of threshold voltages (e.g. as illustrated in FIGS. 8B, 9B, or other such pattern). Memory die 200 may include all features previously shown in FIG. 2 (e.g. sense blocks 212) with additional features for the configuration of FIG. 11. Dummy memory cell configuration circuit 1150 may apply a programming scheme to dummy memory cells (e.g. a programming scheme as previously described with respect to data memory cells). For example, dummy memory cells may be substantially identical to data memory cells and low and high threshold voltages of dummy memory cells may correspond to two threshold voltage ranges that are assigned to data states in data memory cells (e.g. two of the data states illustrated in FIG. 5). Dummy memory cell configuration circuit 1150 may operate in combination with or be combined with write circuits used to write data to data memory cells. In some cases, dummy memory cell configuration is a one-time operation (e.g. performed at a factory as part of an initial configuration procedure). In some cases, dummy memory cell configuration may be performed after a period operation (e.g. to return dummy memory cell threshold voltages to desired levels, or to change threshold voltage patterns, or for other appropriate reason).

FIG. 11 also shows dummy word line voltage scheme selector 1152, which may select an appropriate dummy word line voltage scheme according to the NAND strings and bit lines being accessed. Dummy word line voltage scheme selector 1152 may operate in combination with or be combined with read circuits (e.g. as previously described) so that an appropriate word line voltage scheme is applied for a given read operation (e.g. dummy word line voltages are coordinated with word line and select line voltages in a given read step based on addresses of data to be read). For example, dummy word line voltage scheme selector 1152 in combination with any dummy word line driver circuits may apply different dummy word line voltage schemes to dummy word lines in order to individually select a first and second group of NAND strings and may be considered a means for applying different dummy word line voltage schemes to dummy word lines coupled to the plurality of NAND strings to individually select the first group of NAND strings and the second group of NAND strings. Dummy word line voltage selector 1152 (in combination with dummy word line driver circuits) acts as a string select circuit that is configured to apply a plurality of dummy word line voltage schemes to multiple dummy word lines.

Figure 12:
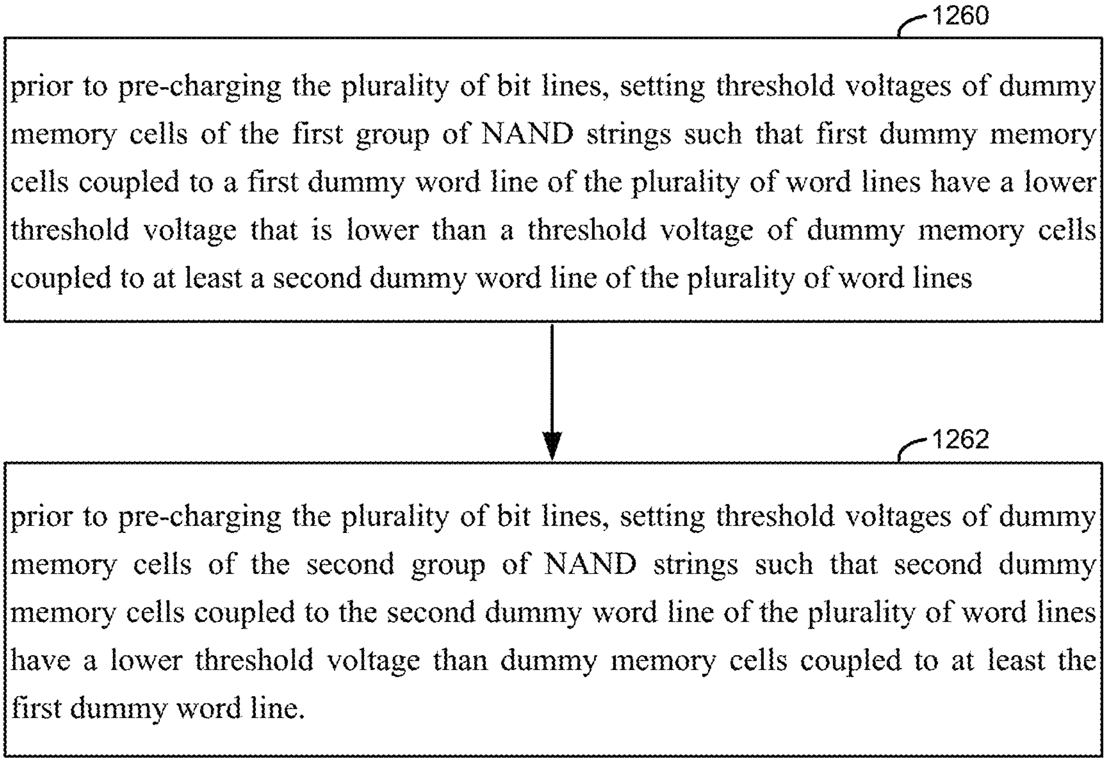
FIG. 12 illustrates an example of a method that includes setting threshold voltages of dummy memory cells.

FIG. 12 shows an example of a process that may be implemented to configure dummy memory cells to implement aspects of the present technology (e.g. using dummy memory cell configuration circuit 1150 to configure dummy memory cells as illustrated in FIG. 8B or 9B). The method includes, prior to pre-charging the plurality of bit lines (e.g. during a memory configuration procedure), setting threshold voltages of dummy memory cells of the first group of NAND strings such that first dummy memory cells coupled to a first dummy word line of the plurality of word lines have a lower threshold voltage that is lower than a threshold voltage of dummy memory cells coupled to at least a second dummy word line of the plurality of word lines 1260. The process further includes, prior to pre-charging the plurality of bit lines, setting threshold voltages of dummy memory cells of the second group of NAND strings such that second dummy memory cells coupled to the second dummy word line of the plurality of word lines have a lower threshold voltage than dummy memory cells coupled to at least the first dummy word line 1262.

Figure 13:
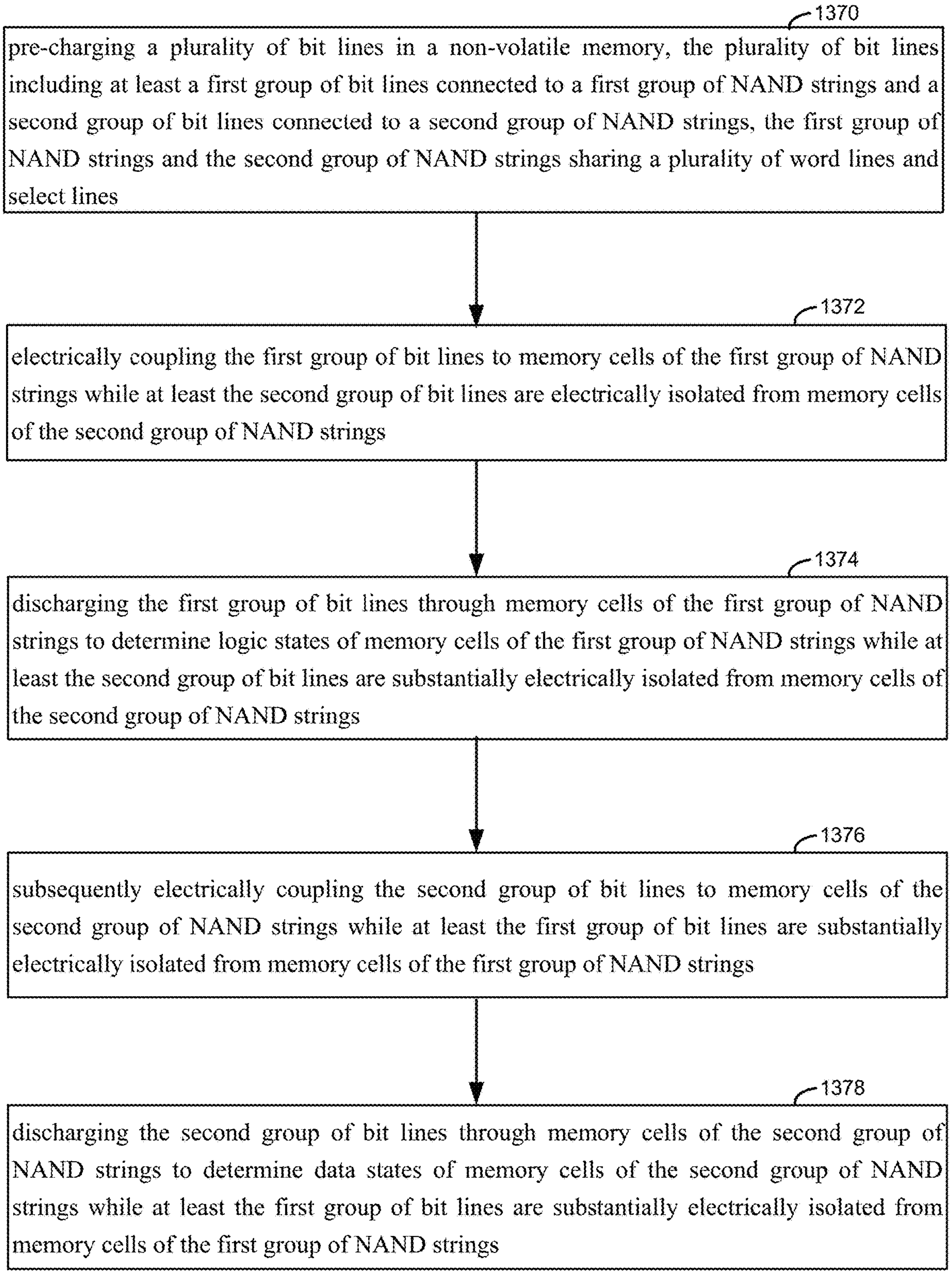
FIG. 13 illustrates an example of a method that includes electrically coupling and isolating different groups of NAND strings.

FIG. 13 shows an example of a process that may implement aspects of the present technology in a non-volatile memory (e.g. in memory structure 202) using suitable circuits (e.g. as illustrated in FIG. 11). The process includes pre-charging a plurality of bit lines in a non-volatile memory, the plurality of bit lines including at least a first group of bit lines connected to a first group of NAND strings and a second group of bit lines connected to a second group of NAND strings, the first group of NAND strings and the second group of NAND strings sharing a plurality of word lines and select lines 1370. The process further includes electrically coupling the first group of bit lines to memory cells of the first group of NAND strings while at least the second group of bit lines are electrically isolated from memory cells of the second group of NAND strings 1372 and discharging the first group of bit lines through memory cells of the first group of NAND strings to determine data states of memory cells of the first group of NAND strings while at least the second group of bit lines are substantially electrically isolated from memory cells of the second group of NAND strings 1374. This may be performed in response to a read request directed to addresses in the first group of NAND strings and may allow a low-noise reading of memory cell data states in the first group of NAND strings. The process further includes subsequently electrically coupling the second group of bit lines to memory cells of the second group of NAND strings while at least the first group of bit lines are substantially electrically isolated from memory cells of the first group of NAND strings 1376 and discharging the second group of bit lines through memory cells of the second group of NAND strings to determine data states of memory cells of the second group of NAND strings while at least the first group of bit lines are substantially electrically isolated from memory cells of the first group of NAND strings 1378. It will be understood that the steps illustrated are for example only and that one or more steps may be omitted and/or additional steps performed according to aspects of the present technology.

While the example of FIG. 13 refers to a first and second group of NAND strings and bit lines, a plurality of bit lines may additionally include a third group of bit lines connected to a third group of NAND strings and a fourth group of bit lines connected to a fourth group of NAND strings (and, in some cases additional groups) and a method may include individually selecting each of the first, second, third and fourth (and any additional) groups of bit lines and corresponding NAND strings in sequence and discharging each selected group of bit lines through a corresponding group of NAND strings to determine data states of memory cells of the corresponding group of NAND strings while all unselected groups of bit lines are substantially electrically isolated from memory cells of unselected groups of NAND strings. More than four groups may be similarly configured and may be similarly operated.

An example of an apparatus includes a plurality of NAND strings having a common set of word lines, each NAND string including data memory cells for data storage and dummy memory cells connected in series with the data memory cells, a first group of NAND strings of the plurality of NAND strings including dummy memory cells with a first pattern of threshold voltages and a second group of NAND strings of the plurality of NAND strings including dummy memory cells with a second pattern of threshold voltages for separate isolation of data memory cells of the first and second groups of NAND strings from corresponding bit lines.

The first pattern of threshold voltages may include dummy memory cells coupled to a first dummy word line having a first threshold voltage and dummy memory cells coupled to a second dummy word line having a second threshold voltage that is higher than the first threshold voltage; and the second pattern of threshold voltages may include dummy memory cells coupled to the first dummy word line having the second threshold voltage and dummy memory cells coupled to the second dummy word line having the first threshold voltage. The apparatus may further include a string select circuit configured to apply a plurality of dummy word line voltage schemes to at least the first dummy word line and the second dummy word line. The plurality of dummy word line voltage schemes may include at least a first scheme to turn on all dummy memory cells of the first group of NAND strings without turning on one or more dummy memory cells of the second group of NAND strings and a second scheme to turn on all dummy memory cells of the second group of NAND strings without turning on one or more dummy memory cells of the first group of NAND strings. The plurality of NAND strings may include at least four groups of NAND strings, each NAND string may include at least four dummy memory cells coupled to four dummy word lines, and each group of NAND strings may have a corresponding pattern of threshold voltages for individual selection using a corresponding dummy word line voltage scheme. Each group of NAND strings may have dummy memory cells along a different dummy word line configured with a lower threshold voltage than other dummy memory cells in the same string. A corresponding dummy word line voltage scheme for individual selection of an individual group of NAND strings may include lower dummy word line voltage for a dummy word line coupled to dummy memory cells configured with lower threshold voltage in the individual group of NAND strings. The apparatus may further include a first group of bit lines connected to the first group of NAND strings, a second group of bit lines connected to the second group of NAND strings, a bit line pre-charge circuit configured to pre-charge the first group of bit lines and the second group of bit lines, and a dummy word line voltage scheme selector configured to select a first dummy word line voltage scheme to electrically couple the first group of bit lines to memory cells of the first group of NAND strings and to electrically isolate the second group of bit lines from memory cells of the second group of NAND strings for discharge of the first group of bit lines. The plurality of NAND strings may further include read circuits coupled to the first plurality of NAND strings, the read circuits configured to determine data states of memory cells of the first plurality of NAND strings as the first plurality of NAND strings discharge and the second group of bit lines are substantially electrically isolated The plurality of NAND strings may be monolithically formed in one or more physical levels of arrays of memory cells having an active area disposed above a silicon substrate with the NAND strings extending vertically through the one or more physical levels.

An example of a method includes pre-charging a plurality of bit lines in a non-volatile memory, the plurality of bit lines including at least a first group of bit lines connected to a first group of NAND strings and a second group of bit lines connected to a second group of NAND strings, the first group of NAND strings and the second group of NAND strings sharing a plurality of word lines and select lines; and electrically coupling the first group of bit lines to memory cells of the first group of NAND strings while at least the second group of bit lines are electrically isolated from memory cells of the second group of NAND strings.

The method may further include discharging the first group of bit lines through memory cells of the first group of NAND strings to determine data states of memory cells of the first group of NAND strings while at least the second group of bit lines are substantially electrically isolated from memory cells of the second group of NAND strings. The method may further include subsequently electrically coupling the second group of bit lines to memory cells of the second group of NAND strings while at least the first group of bit lines are substantially electrically isolated from memory cells of the first group of NAND strings; and discharging the second group of bit lines through memory cells of the second group of NAND strings to determine data states of memory cells of the second group of NAND strings while at least the first group of bit lines are substantially electrically isolated from memory cells of the first group of NAND strings. The plurality of bit lines may additionally include a third group of bit lines connected to a third group of NAND strings and a fourth group of bit lines connected to a fourth group of NAND strings. The method may further include individually selecting each of the first, second, third and fourth groups of bit lines and corresponding NAND strings in sequence; and discharging each selected group of bit lines through a corresponding group of NAND strings to determine data states of memory cells of the corresponding group of NAND strings while all unselected groups of bit lines are substantially electrically isolated from memory cells of unselected groups of NAND strings. Electrically coupling the first group of bit lines to memory cells of the first group of NAND strings while at least the second group of bit lines are substantially electrically isolated from memory cells of the second group of NAND strings may include applying a first set of dummy word line voltages to turn on dummy memory cells of the first group of NAND strings and not turn on dummy memory cells of the second group of NAND strings. The method may further include, prior to pre-charging the plurality of bit lines, setting threshold voltages of dummy memory cells of the first group of NAND strings such that first dummy memory cells coupled to a first dummy word line of the plurality of word lines have a lower threshold voltage that is lower than a threshold voltage of dummy memory cells coupled to at least a second dummy word line of the plurality of word lines; and prior to pre-charging the plurality of bit lines, setting threshold voltages of dummy memory cells of the second group of NAND strings such that second dummy memory cells coupled to the second dummy word line of the plurality of word lines have a lower threshold voltage than dummy memory cells coupled to at least the first dummy word line. Electrically coupling the first group of bit lines to memory cells of the first group of NAND strings while at least the second group of bit lines are substantially electrically isolated from memory cells of the second group of NAND strings may include applying a first voltage to the first dummy word line and a second voltage to the second dummy word line, the first voltage sufficient to turn on the first dummy memory cells having the lower threshold voltage and not turn on other dummy memory cells coupled to the first dummy word line.

An example of a system includes a plurality of NAND strings coupled to a common set of word lines, the plurality of NAND strings including at least a first group of NAND strings and a second group of NAND strings; and means for applying different dummy word line voltage schemes to dummy word lines coupled to the plurality of NAND strings to individually select the first group of NAND strings and the second group of NAND strings.

The apparatus may further include means for individually coupling or isolating a group of NAND strings and corresponding bit lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:

a plurality of NAND strings having a common set of word lines, each NAND string including data memory cells for data storage and dummy memory cells connected in series with the data memory cells, a first group of NAND strings of the plurality of NAND strings including dummy memory cells with a first pattern of threshold voltages and a second group of NAND strings of the plurality of NAND strings including dummy memory cells with a second pattern of threshold voltages for separate isolation of data memory cells of the first and second groups of NAND strings from corresponding bit lines using a plurality of dummy word line voltage schemes including at least a first scheme to turn on all dummy memory cells of the first group of NAND strings without turning on one or more dummy memory cells of the second group of NAND strings and a second scheme to turn on all dummy memory cells of the second group of NAND strings without turning on one or more dummy memory cells of the first group of NAND strings.

2. The apparatus of claim 1, wherein:

the first pattern of threshold voltages includes dummy memory cells coupled to a first dummy word line having a first threshold voltage and dummy memory cells coupled to a second dummy word line having a second threshold voltage that is higher than the first threshold voltage; and the second pattern of threshold voltages includes dummy memory cells coupled to the first dummy word line having the second threshold voltage and dummy memory cells coupled to the second dummy word line having the first threshold voltage.

3. The apparatus of claim 2, further comprising a string select circuit configured to apply the plurality of dummy word line voltage schemes to at least the first dummy word line and the second dummy word line.

4. The apparatus of claim 3, wherein the plurality of dummy word line voltage schemes further includes at least a third scheme to turn on all dummy memory cells of a third group of NAND strings without turning on one or more dummy memory cells of the first, second and a fourth groups of NAND strings and a fourth scheme to turn on all dummy memory cells of the fourth group of NAND strings without turning on one or more dummy memory cells of the first, second and third groups of NAND strings.

5. The apparatus of claim 1, wherein the plurality of NAND strings includes at least four groups of NAND strings, each NAND string includes at least four dummy memory cells coupled to four dummy word lines, and each group of NAND strings has a corresponding pattern of threshold voltages for individual selection using a corresponding dummy word line voltage scheme.

6. The apparatus of claim 5, wherein each group of NAND strings has dummy memory cells along a different dummy word line configured with a lower threshold voltage than other dummy memory cells in the same string.

7. The apparatus of claim 6, wherein a corresponding dummy word line voltage scheme for individual selection of an individual group of NAND strings includes lower dummy word line voltage for a dummy word line coupled to dummy memory cells configured with lower threshold voltage in the individual group of NAND strings.

8. The apparatus of claim 1, further comprising:

a first group of bit lines connected to the first group of NAND strings;

a second group of bit lines connected to the second group of NAND strings;

a bit line pre-charge circuit configured to pre-charge the first group of bit lines and the second group of bit lines; and a dummy word line voltage scheme selector configured to select a first dummy word line voltage scheme to electrically couple the first group of bit lines to memory cells of the first group of NAND strings and to electrically isolate the second group of bit lines from memory cells of the second group of NAND strings for separate discharge of the first group of bit lines.

9. The apparatus of claim 8, further comprising read circuits coupled to the first plurality of NAND strings, the read circuits configured to determine data states of memory cells of the first plurality of NAND strings as the first plurality of NAND strings discharge and the second group of bit lines are substantially electrically isolated.

10. The apparatus of claim 1, wherein the plurality of NAND strings are monolithically formed in one or more physical levels of arrays of memory cells having an active area disposed above a silicon substrate with the NAND strings extending vertically through the one or more physical levels.

11. A method comprising:

pre-charging a plurality of bit lines in a non-volatile memory, the plurality of bit lines including at least a first group of bit lines connected to a first group of NAND strings and a second group of bit lines connected to a second group of NAND strings, the first group of NAND strings and the second group of NAND strings sharing a plurality of word lines and select lines;

electrically coupling the first group of bit lines to memory cells of the first group of NAND strings and discharging the first group of bit lines through memory cells of the first group of NAND strings while at least the second group of bit lines are electrically isolated from memory cells of the second group of NAND strings; and electrically coupling the second group of bit lines to memory cells of the second group of NAND strings and discharging the second group of bit lines through memory cells of the second group of NAND strings while at least the first group of bit lines are substantially electrically isolated from memory cells of the first group of NAND strings.

12. The method of claim 11, further comprising:

reading memory cells of the first group of NAND strings while discharging the first group of bit lines.

13. The method of claim 12, further comprising:

receiving a read command directed to memory cells of the first group of NAND strings after pre-charging the plurality of bit lines; and reading the memory cells of the first group of NAND strings in response to the read command identifying the memory cells of the first group of NAND strings.

14. The method of claim 11, wherein the plurality of bit lines additionally includes a third group of bit lines connected to a third group of NAND strings and a fourth group of bit lines connected to a fourth group of NAND strings.

15. The method of claim 14, further comprising:

individually selecting each of the first, second, third and fourth groups of bit lines and corresponding NAND strings in sequence; and discharging each selected group of bit lines through a corresponding group of NAND strings to determine data states of memory cells of the corresponding group of NAND strings while all unselected groups of bit lines are substantially electrically isolated from memory cells of unselected groups of NAND strings.

16. The method of claim 11 wherein electrically coupling the first group of bit lines to memory cells of the first group of NAND strings while at least the second group of bit lines are substantially electrically isolated from memory cells of the second group of NAND strings includes applying a first set of dummy word line voltages to turn on dummy memory cells of the first group of NAND strings and not turn on dummy memory cells of the second group of NAND strings.

17. The method of claim 16, further comprising:

prior to pre-charging the plurality of bit lines, setting threshold voltages of dummy memory cells of the first group of NAND strings such that first dummy memory cells coupled to a first dummy word line of the plurality of word lines have a lower threshold voltage that is lower than a threshold voltage of dummy memory cells coupled to at least a second dummy word line of the plurality of word lines; and prior to pre-charging the plurality of bit lines, setting threshold voltages of dummy memory cells of the second group of NAND strings such that second dummy memory cells coupled to the second dummy word line of the plurality of word lines have a lower threshold voltage than dummy memory cells coupled to at least the first dummy word line.

18. The method of claim 17, wherein electrically coupling the first group of bit lines to memory cells of the first group of NAND strings while at least the second group of bit lines are substantially electrically isolated from memory cells of the second group of NAND strings includes applying a first voltage to the first dummy word line and a second voltage to the second dummy word line, the first voltage sufficient to turn on the first dummy memory cells having the lower threshold voltage and not turn on other dummy memory cells coupled to the first dummy word line.

19. A system comprising:

means for pre-charging a first group of bit lines connected to a first group of NAND strings and a second group of bit lines connected to a second group of NAND strings, the first and second groups of NAND strings having a common set of word lines and dummy word lines, applying a first dummy word line voltage scheme to the dummy word lines coupled to the first and second groups of NAND strings to discharge the first group of bit lines while isolating the second group of bit lines and applying a second dummy word line voltage scheme to the dummy word lines coupled to the first and second groups of NAND strings to discharge the second group of bit lines while isolating the first group of bit lines.

20. The system of claim 19 further comprising means for individually coupling or isolating a group of NAND strings and corresponding bit lines.

* * * * *